(12) United States Patent
Dehe et al.

(10) Patent No.: US 9,181,080 B2
(45) Date of Patent: Nov. 10, 2015

(54) MEMS MICROPHONE WITH LOW PRESSURE REGION BETWEEN DIAPHRAGM AND COUNTER ELECTRODE

(71) Applicant: Infineon Technologies AG, Neubiberg (DE)

(72) Inventors: Alfons Dehe, Reutlingen (DE); Andreas Froemel, Ulm (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/931,584

(22) Filed: Jun. 28, 2013

(65) Prior Publication Data

US 2015/0001647 A1    Jan. 1, 2015

(51) Int. Cl.
*B81B 3/00* (2006.01)
*H04R 23/00* (2006.01)
*B81C 1/00* (2006.01)
*H04R 7/02* (2006.01)

(52) U.S. Cl.
CPC ............. *B81B 3/0021* (2013.01); *B81B 3/0078* (2013.01); *B81C 1/00158* (2013.01); *H04R 7/02* (2013.01); *H04R 23/006* (2013.01); *B81B 2201/0257* (2013.01); *B81B 2201/0264* (2013.01); *B81B 2203/0127* (2013.01); *H04R 2201/003* (2013.01); *H04R 2410/03* (2013.01)

(58) Field of Classification Search
CPC .................. B81B 3/0027; B81B 3/001; B81B 2201/0257; B81B 2201/0285; B81B 2203/0127; H04R 7/02; H04R 23/006; H04R 2201/003; H04R 2410/03
USPC .................. 381/174, 175; 257/254, 416, 419
See application file for complete search history.

(56) References Cited

U.S. PATENT DOCUMENTS

| 6,075,867 | A | 6/2000 | Bay et al. | |
|---|---|---|---|---|
| 6,597,048 | B1 * | 7/2003 | Kan | 257/415 |
| 7,190,038 | B2 | 3/2007 | Dehe et al. | |
| 7,473,572 | B2 | 1/2009 | Dehe et al. | |
| 7,889,882 | B2 * | 2/2011 | Marshall | 381/355 |
| 8,063,458 | B2 * | 11/2011 | Loeffler et al. | 257/419 |
| 8,169,041 | B2 | 5/2012 | Pahl et al. | |
| 8,265,287 | B2 * | 9/2012 | Kageyama | 381/59 |
| 2009/0114954 | A1 * | 5/2009 | Brosnihan et al. | 257/254 |
| 2011/0108838 | A1 * | 5/2011 | Kageyama | 257/49 |
| 2012/0133005 | A1 * | 5/2012 | Langeries et al. | 257/416 |

OTHER PUBLICATIONS

AMI, "Neumann/Telefunken U47 Schematic", 2011, www.tab-funkenwerk.com, all pages.*
Bay, J., "Silicon Microphone for Hearing Aid Applications," Mikroelektronic Centret—Microtronic A/S, Jun. 1997, 20 pages.
Wang, C.C., et al., "Contamination-Insensitive Differential Capacitive Pressure Sensors," Journal of Microelectromechanical Systems, vol. 9, No. 4, Dec. 2000, pp. 538-543.

* cited by examiner

*Primary Examiner* — Jesse Elbin
(74) *Attorney, Agent, or Firm* — Slater & Matsil, L.L.P.

(57) ABSTRACT

A MEMS microphone includes a first diaphragm element, a counter electrode element, and a low pressure region between the first diaphragm element and the counter electrode element. The low pressure region has a pressure less than an ambient pressure.

24 Claims, 23 Drawing Sheets

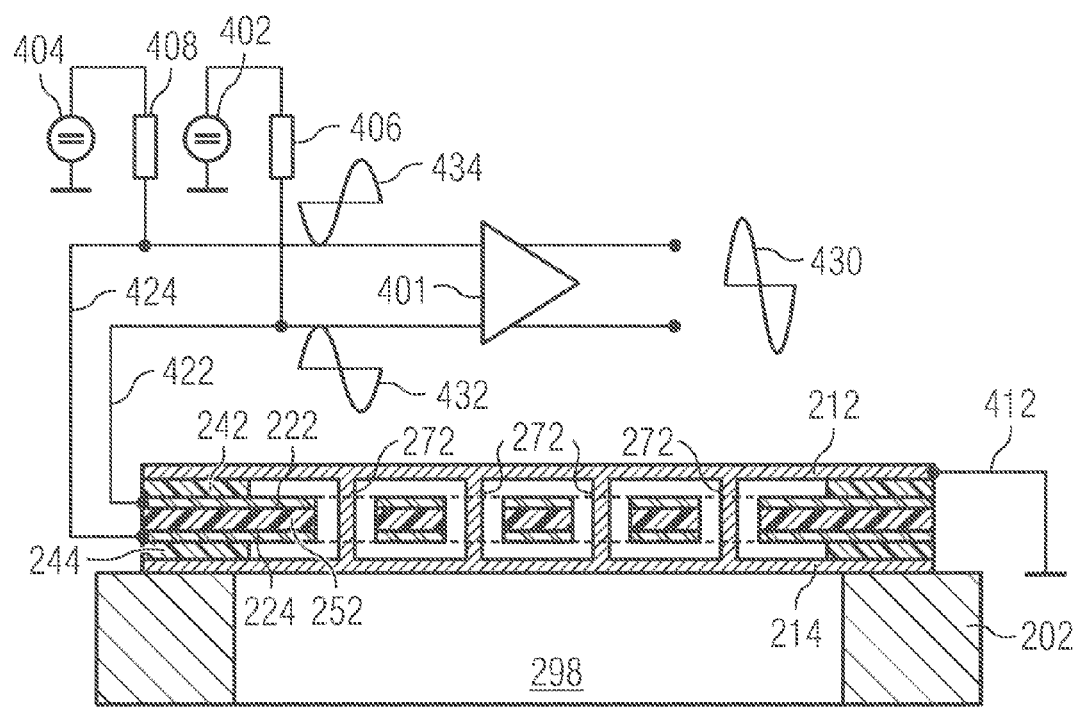

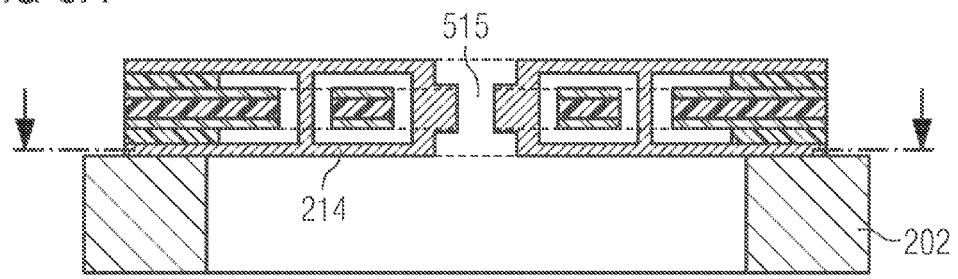
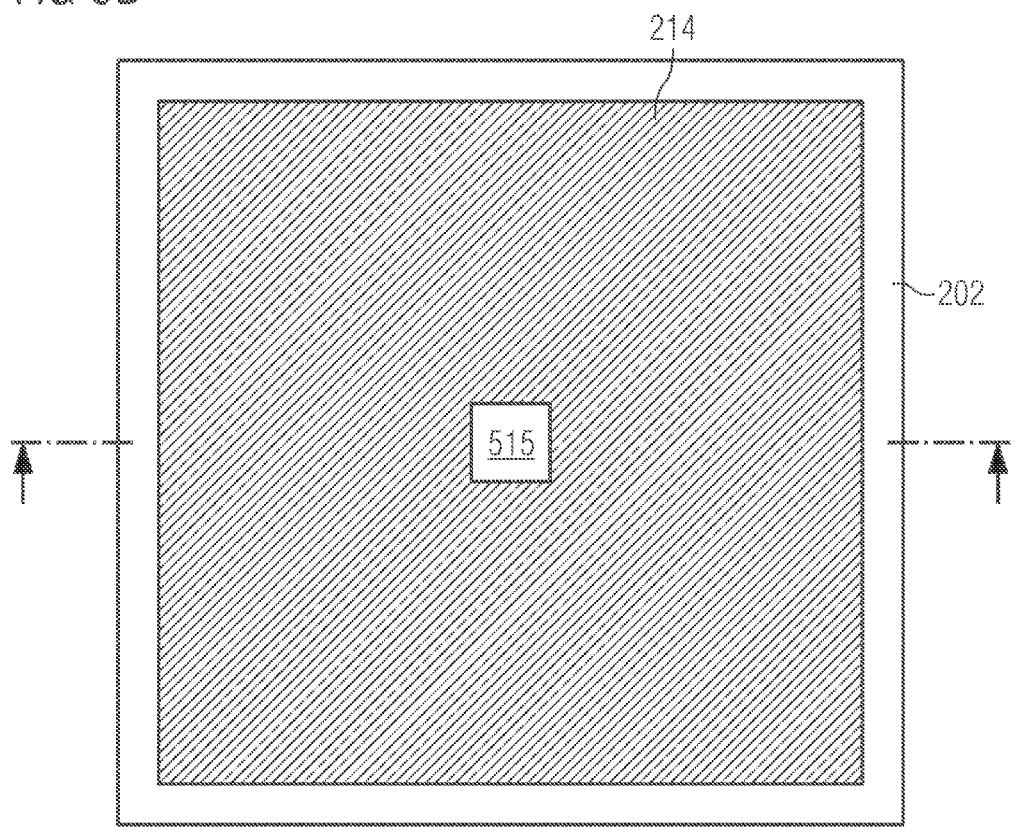

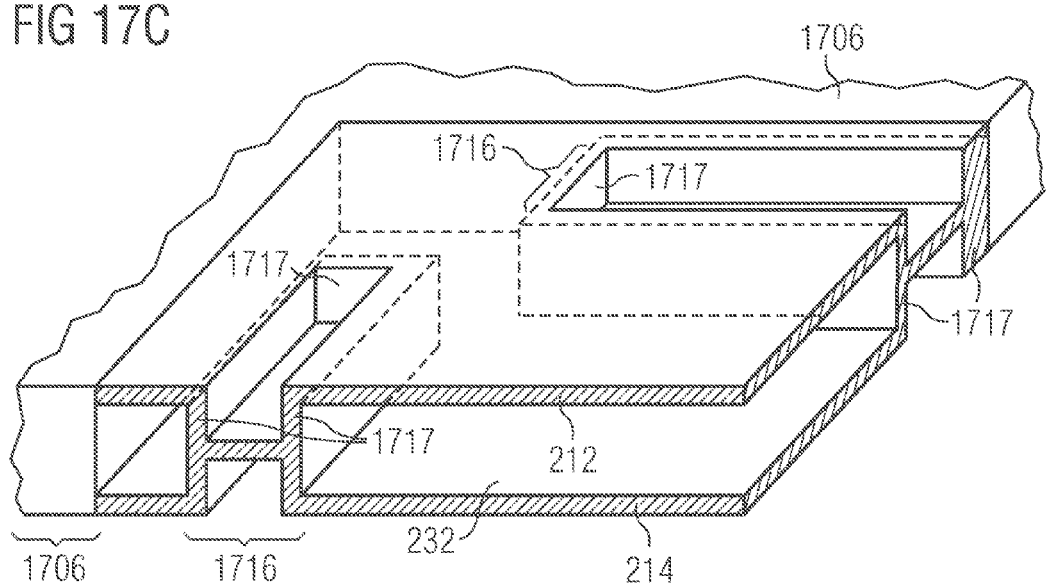

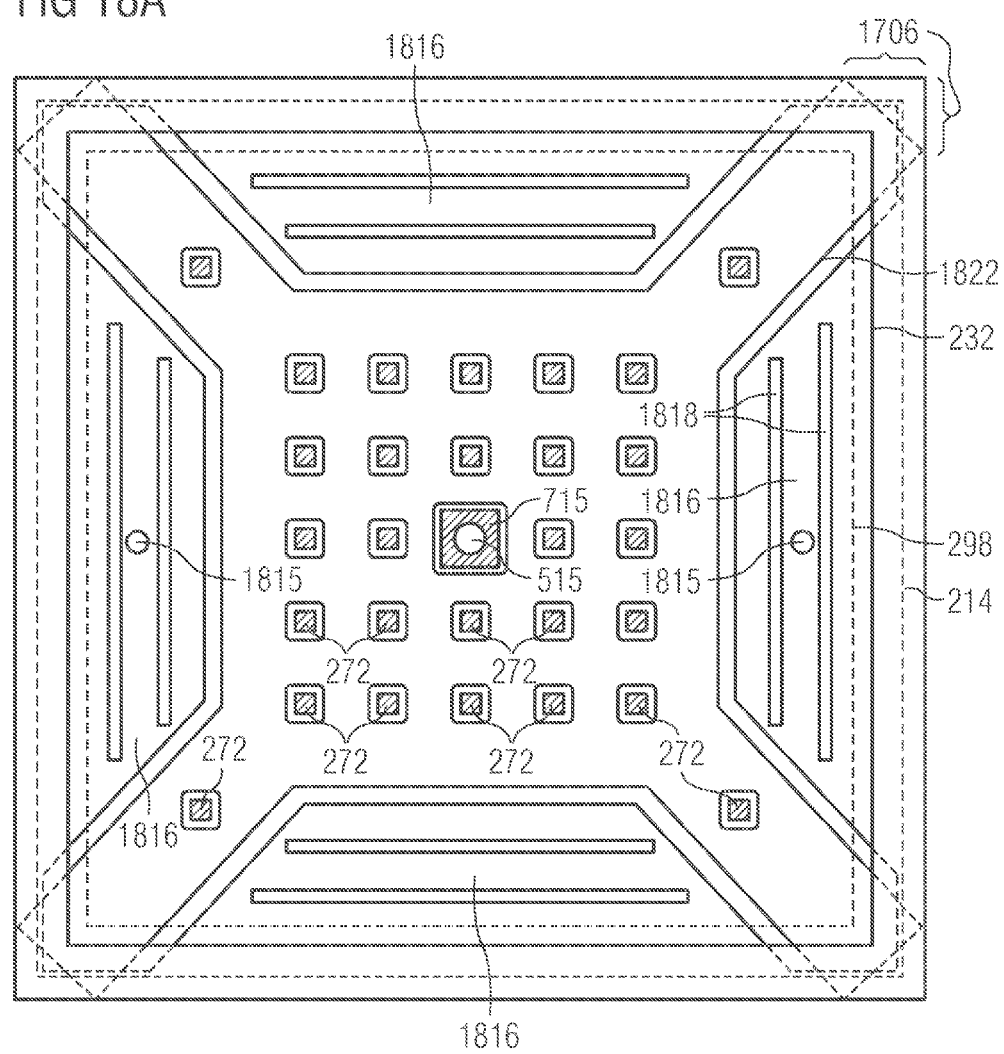

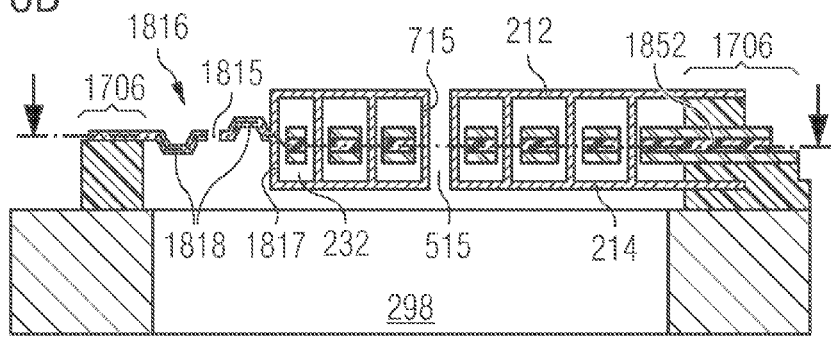
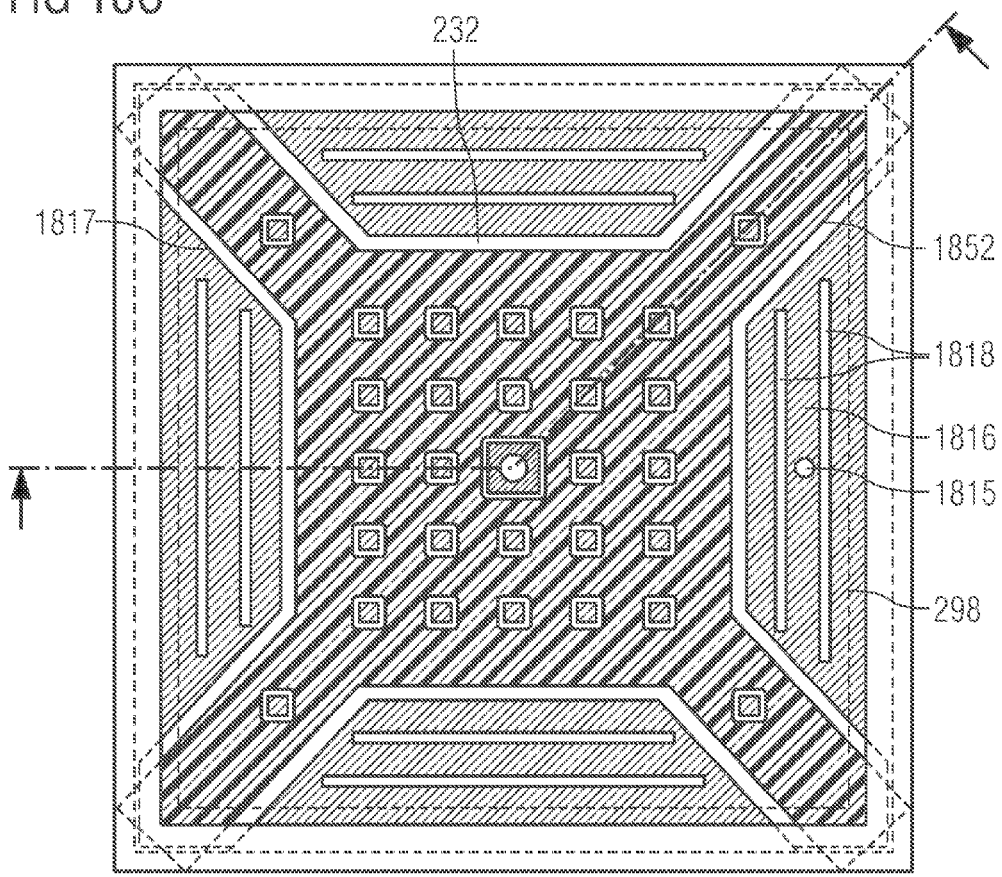

MEMS MICROPHONE WITH LOW PRESSURE REGION BETWEEN DIAPHRAGM AND COUNTER ELECTRODE

TECHNICAL FIELD

Embodiments relate to a microelectromechanical system (MEMS) microphone. Some embodiments relate to a method for manufacturing a MEMS microphone. Some embodiments relate to a MEMS sound transducer. Some embodiments relate to a (near-) vacuum microphone and/or a (near-) vacuum speaker.

BACKGROUND

When designing transducers such as pressure sensors, acceleration sensors, microphones, or loudspeakers, it may be typically desirable to achieve a high signal-to-noise ratio (SNR). The continuous miniaturization of transducers may pose new challenges with respect to the desired high signal-to-noise ratio. Microphones and to some extent also loudspeakers that may be used in, for example, mobile phones and similar devices may nowadays be implemented as silicon microphones or microelectromechanical systems. In order to be competitive and provide the expected performance, silicon microphones may need high SNR. However, taking the condenser microphone as an example, the SNR may be typically limited by condenser microphone construction.

The issue of the limited SNR that can be achieved with current designs of condenser microphones, especially when implemented as a MEMS, can be explained as follows. A condenser microphone may typically comprise a diaphragm and a backplate that may serve as a counter electrode. The sound may need to pass through the backplate and as a consequence, the backplate may be typically perforated. Note that the backplate may need to be perforated even in those designs in which the backplate may be arranged behind the diaphragm (i.e., at the side of the diaphragm facing away from the direction of arrival of the sound), because during operation the diaphragm may push some of the air in the volume between the diaphragm and the backplate through the perforated backplate to a backside cavity. Without the backside cavity and the perforation in the backplate, the volume between the diaphragm and the backplate might act like a very stiff spring and hence might prevent the diaphragm from significantly vibrating in response to the arriving sound.

A different design of capacitive microphones may use a so-called comb drive where the diaphragm and the counter electrode have a plurality of interdigitated comb fingers at a lateral circumference of the diaphragm. These comb sensor microphones may have reduced noise due to the missing backplate. Still there may be a fluidic element of noise in between the interdigitated comb fingers.

SUMMARY OF THE INVENTION

A MEMS microphone may be provided. The MEMS microphone may comprise a first diaphragm element, a counter electrode element and a low-pressure region between the first diaphragm element and the counter electrode element. The low-pressure region may have a pressure less than an ambient pressure.

A method for manufacturing a MEMS microphone may be provided. The method may comprise creating a low pressure region between a first diaphragm element and a counter electrode element. The method may further comprise durably preventing the entry of matter into the low-pressure region to durably maintain, on average, a specified low-pressure within the low-pressure region.

BRIEF DESCRIPTION OF THE DRAWINGS

Embodiments of the present invention are described herein making reference to the appended drawings.

FIG. 4 shows the schematic cross section of FIG. 2 and ad-ditionally a schematic circuit diagram illustrating a power supply and sensing circuit for the MEMS microphone;

FIGS. 6A and 6B show schematic cross-sections of the same MEMS microphone at a different cross-section position;

FIG. 17C shows a schematic perspective cutaway view of a portion of the MEMS microphone in FIGS. 17A and 17B;

FIG. 18A shows a schematic horizontal cross-section of a MEMS microphone comprising an X-shaped counter electrode;

FIGS. 18B and 18C show schematic cross sections of the MEMS microphone from FIG. 18A;

Figure 1:
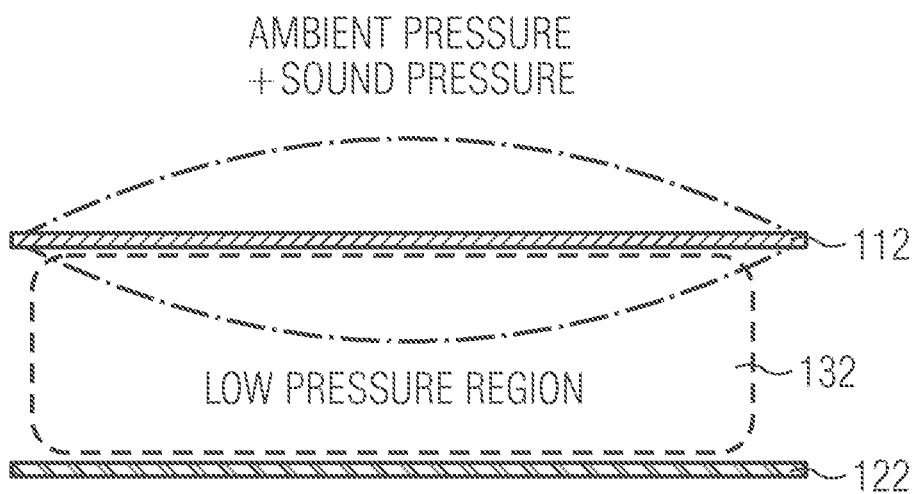
FIG. 1 shows a schematic cross-section of a MEMS microphone comprising a single diaphragm element and a low-pressure region.

Equal or equivalent elements or elements with equal or equivalent functionality are denoted in the following description by equal or equivalent reference numerals.

DETAILED DESCRIPTION OF ILLUSTRATIVE EMBODIMENTS

In the following description, a plurality of details are set forth to provide a more thorough explanation of embodiments of the present invention. However, it will be apparent to those skilled in the art that embodiments of the present invention may be practiced without these specific details. In other instances, well-known structures and devices are shown in block diagram form rather than in detail in order to avoid obscuring embodiments of the present invention. In addition, features of the different embodiments described hereinafter may be combined with each other, unless specifically noted otherwise.

Standard condenser microphones may use a parallel plate capacitance with change of gap distance by a membrane displacement. This may imply noise of air moving through the perforations. When studying the issue of SNR in today's microphones, the perforated backplate may be identified as one of the major noise contributors. One possible solution could be to remove the perforated backplate, but that might need a new sensor concept. Experiments and simulations performed by the inventors have revealed that the removal of the perforated backplate could, in theory, improve the SNR by as much as 4 to 27 dB (decibel sound pressure level). For a relatively large microphone having an active volume of 40 mm3, the SNR may be approximately 71 dB(A) with the perforated backplate being present. After the removal of the perforated backplate, the SNR may have increased to 98 dB(A). For a relatively small microphone having an active volume of 2.3 mm3, the improvement may be not as significant, but still 4 dB from 69 dB(A) with the perforated backplate present to 73 dB(A) after removal of the perforated backplate.

Noise in acoustical systems may come from the viscous flow of air in the microstructures and may cause damping and dissipative losses. For a capacitive microphone concept some aspects described herein may teach how to encapsulate the static reference electrode (counter electrode) under vacuum or under a low-pressure atmosphere inside the movable membrane or diaphragm. Further aspects disclosed herein may teach how and under which conditions a low-pressure region can be provided between a single diaphragm element and the counter electrode element.

FIG. 1 schematically illustrates a concept for a MEMS microphone in which a low-pressure region 132 may be provided between a diaphragm element 112 and a counter electrode element 122. FIG. 1 schematically shows a possible embodiment as an example. For reasons of consistency with subsequent parts of the description, the diaphragm element 112 may also be referred to as "first diaphragm element." The diaphragm element 112 may be exposed at one of its sides to an ambient pressure and potentially a sound pressure. This side of the diaphragm element 112 may also be regarded as a sound receiving main surface of the diaphragm element 112. At its other main surface the diaphragm element 112 may be adjacent to the low-pressure region 132. The diaphragm element 112 may be implemented as a membrane or membrane element. A displacement of the diaphragm element 112 in response to the sound pressure may be schematically illustrated in FIG. 1 by dash-dot-dot lines (note that the displacement may be shown somewhat exaggerated for illustrative purposes).

The low-pressure region 132 may be schematically illustrated in FIG. 1 by a dashed line. The low-pressure region 132 has a pressure that may be typically less than an ambient pressure or a standard atmospheric pressure. The low-pressure region 132 may be adjacent and typically in direct contact with the diaphragm element 112 and also with the counter electrode element 122.

The diaphragm element 112 may be biased by a pressure difference between the ambient pressure and the pressure within the low-pressure region 132, which typically may be less than the ambient pressure. Accordingly, the diaphragm element 112 may assume a corresponding rest position or configuration when no sound arrives at the diaphragm element 112. The lower pressure may result in lower damping according to the density of the fluid inside the low pressure or vacuum region. At the same time the membrane withstanding the normal pressure and sensing the sound may not need any back volume since there might be less or no force transferred to the second electrode via a fluidic coupling. To give some numbers as an example, the membrane might have to withstand an absolute pressure of up to about 100 kPa. The sound pressure to be sensed may be, for example, in a range of up to about 1 mPa or up to 10 mPa.

According to at least one embodiment, the pressure in the low pressure region may be substantially a vacuum or a near-vacuum. In other examples of implementation the pressure in the low pressure region may be less than about 50% of the ambient pressure or the standard atmospheric pressure. It may also be possible that the pressure in the low pressure region may be less than about 45%, 40%, 35%, 30%, 25%, or 20% of the ambient pressure or the standard atmospheric pressure (standard atmospheric pressure may be typically 101.325 KPa or 1013.25 millibars). The pressure in the low pressure region may also be expressed as an absolute pressure, for example less than 50 KPa, less than 40 KPa, less than 30 KPa, or less than 25 KPa. In any event, the pressure in the low pressure region may be typically selected such that it may be lower than the typical range of the atmospheric pressure for weather conditions that should be reasonably expected and for those altitudes with respect to sea level at which the MEMS microphone may be intended to be usable (e.g., up 9000 meters above sea level).

The first diaphragm element may have a diaphragm compliance of at least about 1 nm/Pa. According to alternative implementations the diaphragm compliance may be at least about 2 nm/Pa, at least about 3 nm/Pa, at least about 4 nm/Pa, or at least about 5 nm/Pa. The diaphragm compliance may typically be understood as the inverse of the diaphragm's stiffness. However as used herein, the diaphragm compliance may be normalized to the size of the diaphragm and may express a maximum deflection of the diaphragm when being charged with a specific sound pressure, here 1 Pascal (Pa). The reference sound pressure in air that may be commonly used may be Pref=20 μPa(rms), which approximately corresponds to the threshold of human hearing. With this reference sound pressure, a sound pressure level (SPL) of 94 dB may result in a sound pressure of 1 Pa (for comparison, a jack hammer at 1 meter may have a sound pressure level of approximately 100 dB).

Figure 2:
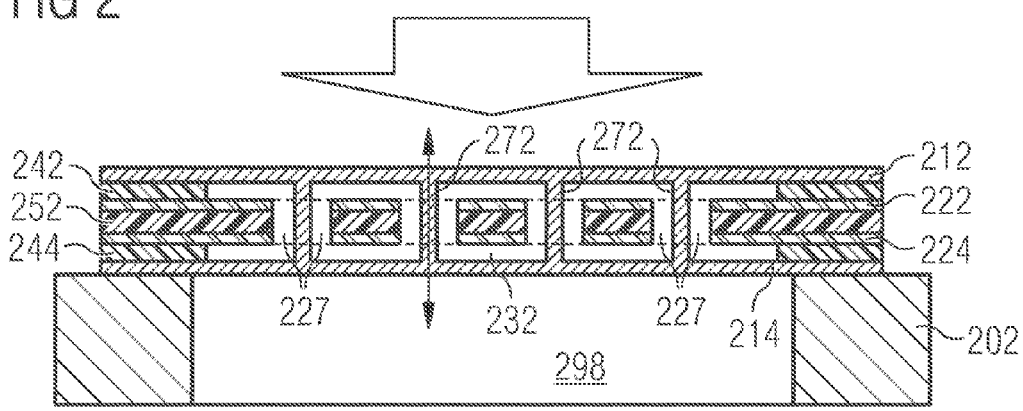
FIG. 2 shows a schematic cross-section of a MEMS microphone, MEMS loudspeaker, or MEMS sound transducer comprising a first diaphragm element and a second diaphragm element enclosing a low-pressure region.

FIG. 2 shows a schematic cross-section through a MEMS microphone that may further comprise a second diaphragm element 214 disposed on an opposite side of the counter electrode element 222 than the first diaphragm element 212. FIG. 2 shows a further possible embodiment. The MEMS microphone may comprise a plurality of pillars or struts 272 extending between the first diaphragm elements 212 and the second diaphragm element 214. The pillars 272 typically do not contact or touch the counter electrode element 222, but rather may pass through the counter electrode element 222 via openings or holes 227 in the counter electrode element 222. In the implementation example schematically illustrated in FIG. 2, the pillars 272 may be integrally formed with the first and second diaphragm elements 212, 214. Hence, the first diaphragm element 212, the second diaphragm element 214, and the pillars 272 may form an integral structure of the same material, for example polycrystalline silicon. Nevertheless, this does not mean that the first diaphragm element 212, the second diaphragm element 214, and the pillars 272 need to be formed concurrently during manufacture of the MEMS microphone. Rather, it may be possible that the second diaphragm element 214 may be formed first on a surface of a substrate 202 (or on a surface of an auxiliary layer such as an etch stop layer) during a first deposition process. Subsequently, the pillars 272 and eventually also the first diaphragm element 212 may be formed during a second deposition process and possibly during a third deposition process. In alternative implementation examples to be described below, the pillars 272 may be made of a different material than the first and second diaphragm elements 212, 214. The first diaphragm element 212 may have a main surface that may face the direction of arrival of a sound (schematically illustrated by an arrow in FIG. 2).

In the MEMS microphone schematically illustrated in cross-section view in FIG. 2 as an example, a second counter electrode element 224 may be provided in addition to the first counter electrode element 222. The second counter electrode element 224 may be spaced apart from the first counter electrode element 222. A counter electrode isolating layer 252 electrically may isolate the first counter electrode element 222 and the second counter electrode element 224 against each other. In the example of a MEMS microphone schematically illustrated in FIG. 2, the first counter electrode element 222, the second counter electrode element 224, and the counter electrode isolating layer 252 may form a counter electrode arrangement or counter electrode structure that may be supported at its periphery or circumference by a support structure. Note that although the three central portions of the counter electrode arrangement depicted in FIG. 2 appear to be "floating" within the low pressure region 232, they may be typically attached to the circumference of the counter electrode structure above and/or beneath the drawing plane of FIG. 2, as indicated by the dashed lines.

In the example schematically illustrated in FIG. 2, the support structure may have a stacked configuration and peripheral portions of the first diaphragm element 212, the second diaphragm element 214, and the counter electrode arrangement 222, 224, 252 may be in planar contact with the support structure at one or two of their main surfaces. The support structure itself may be arranged at a main surface of the substrate 202. On this main surface of the substrate 202 the various layers may be arranged on top of each other in the following order, for example: second diaphragm element 214, second diaphragm isolation 244, second counter electrode element 224, counter electrode isolation 252, first counter electrode element 222, first diaphragm isolation 242, and first diaphragm element 212. A backside cavity 298 may be formed in the substrate 202 in order to allow the second diaphragm element 214 to oscillate in response to a sound wave.

When studying the pressure situation of the structure, it can be observed that the diaphragm structure which comprises the first diaphragm element 212, the pillars 272, and the second diaphragm element 214 may have to be stiff enough to withstand the 1 bar overpressure of the outer atmosphere against the vacuum cavity or low-pressure cavity. In particular, the pillars 272 may be regarded as vertical ridges reaching through holes 227 of the counter electrode arrangement (also called "stator") in order to stabilize the structure. The diaphragm arrangement 212, 214 may be tightly sealed.

FIG. 2 shows the MEMS microphone at its rest position, e.g. when no sound wave arrives at the diaphragm elements 212, 214 which would cause the diaphragm elements 212, 214 to be deflected. At the side of the first diaphragm element 212 at which the sound may arrive, the total pressure may be expressed as p(t)=normal pressure+psound(t). Within the backside cavity 298, only the normal atmospheric pressure may be present, i.e. p0=normal pressure. Within the low-pressure region 232, the pressure may be relatively low, e.g. pgap~0 or pgap<50% ambient pressure.

Figure 3A:
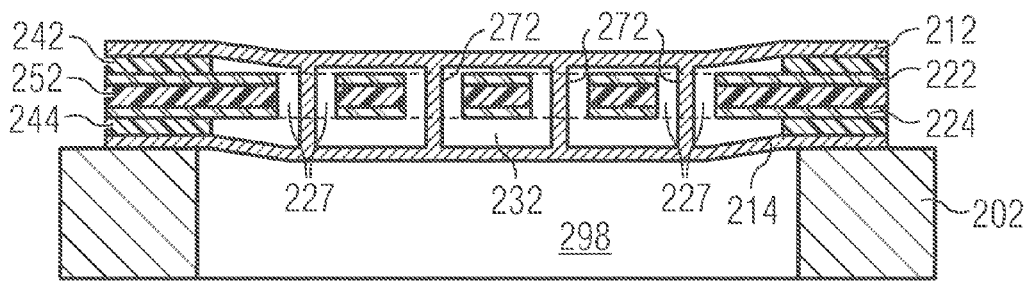
FIGS. 3A and 3B show schematic cross-sections of the MEMS microphone of FIG. 2 during operation while being exposed to a sound.
Figure 3B:
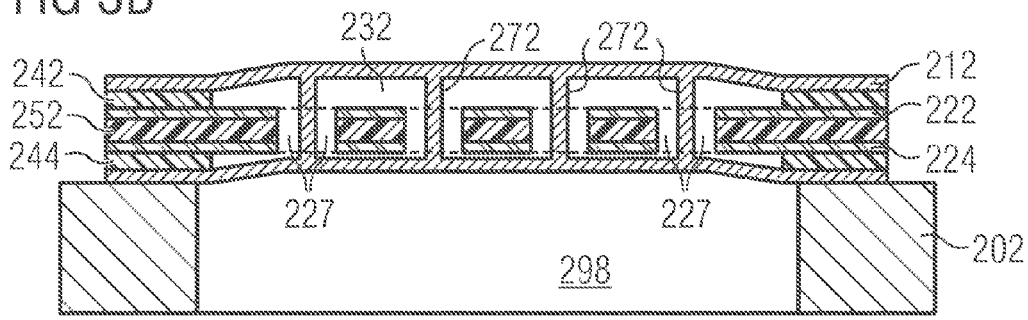
Figure 5A:
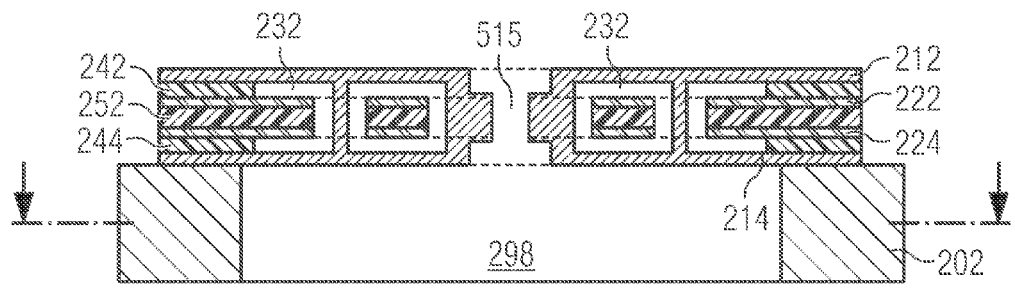
FIGS. 5A and 5B show schematic cross sections of a MEMS microphone at a first cross-section position.
Figure 5B:
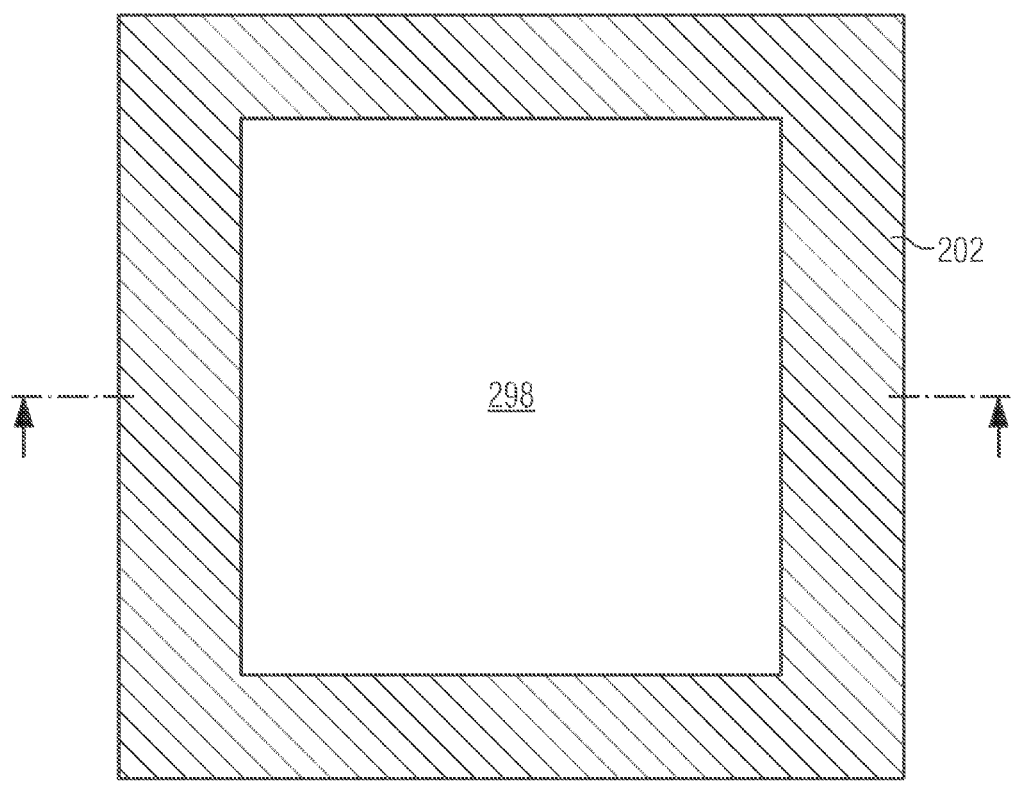

FIGS. 3A and 3B show schematic cross sections through a possible MEMS microphone when the same may be exposed to sound as possible examples and/or embodiments. FIG. 3A shows the situation in which the diaphragm arrangement 212, 214, 272 may be pushed down due to a relative overpressure caused by the sound at the upper side adjacent to the first diaphragm element 212 compared to the reference pressure within the backside cavity 298, i.e., $$p(t)=\text{normal pressure}+|psound|.$$

In FIG. 3B the pressure at the sound receiving side may be lower than the pressure within the backside cavity 298 so that the diaphragm arrangement 212, 214, 272 may be deflected upwards. Accordingly, the diaphragm structure or membrane structure moves up and down with respect to the counter electrode structure 222, 224, 252 (stator) under sound. The underpressure in FIG. 3B can be expressed as $$p(t)=\text{normal pressure}-|psound|.$$

FIG. 4 schematically illustrates an example of how the MEMS microphone may be electrically connected to a power supply circuit and an amplifier. FIG. 4 shows an example of a possible connection. Other arrangements may be possible, too. In FIG. 4, the first and second diaphragm elements 212, 214 may be grounded by a diaphragm connection 412 to an electric ground potential or reference potential. The first counter electrode element 222 may be electrically connected by a first counter electrode connection 422 to a first power supply circuit and also to a first input of an amplifier 401. The first power supply circuit comprises a voltage source 402 and a resistor 406. The resistor 406 may have a very high resistance of several Giga Ohms or even as high as 1 Tera Ohm. The amplifier 401 may be a differential amplifier. The second counter electrode element 224 may be connected by a second counter electrode connection 424 to a second power supply circuit and a second input of the amplifier 401. The second power supply circuit comprises a second voltage source 404 and a second resistor 408 that typically has about the same resistance as the resistor 406. The first and second power supply circuit electrically biases the first and second counter electrode elements 222 and 224, respectively, against the electric reference potential (ground potential). When the diaphragm structure may be deflected in response to an arriving sound, the electric potentials at the first and second counter electrode elements 222, 224 may vary in opposite directions due to the varying capacitances between the diaphragm structure and the first and second counter electrode elements, respectively. This is schematically illustrated in FIG. 4 by a first waveform 432 and a second waveform 434 which may be fed into the first and second input, respectively, of the amplifier 401. The amplifier 401 may generate an amplified output signal 430 based on the input signals 432 and 434, in particular a difference of the input signals 432, 434. The amplified output signal 430 may then be supplied to further components for subsequent signal processing, for example analog-to-digital conversion, filtering, etc.

A possible implementation of a MEMS microphone having a low-pressure region between two diaphragm elements and a counter electrode within the low-pressure region will now be described with respect to FIGS. 5A to 10. FIGS. 5A to 10 show possible embodiments and/or examples of possible implementations. The FIGS. 5A, 6A, 7A, 8A, and 9A may be substantially identical and indicate a location of a corresponding horizontal cross section shown in FIGS. 5B, 6B, 7B, 8B, and 9B, respectively. The example schematically illustrated in FIGS. 5A to 10 may relate to a lateral design including a ventilation hole 515 for static pressure equalization between the ambient atmosphere and the backside cavity 298.

FIG. 6A indicates that the next horizontal cross section, which is schematically illustrated in FIG. 6B, may be performed according to a section plane passing through the second diaphragm element 214. The ventilation hole 515 may have a square cross-section at this position.

Figure 7A:
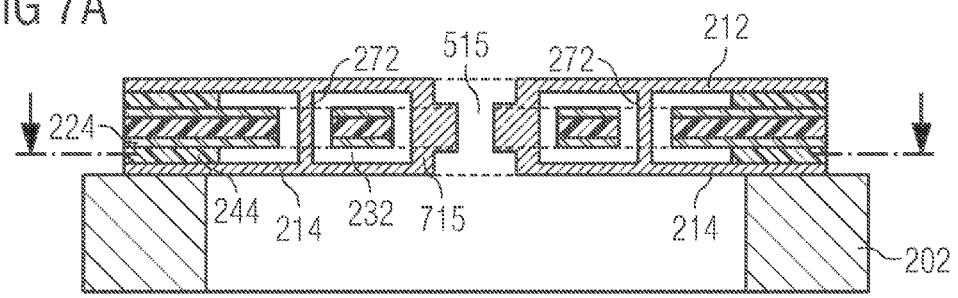
FIGS. 7A and 7B show schematic cross sections of the same MEMS microphone at a further cross-section position.
Figure 7B:
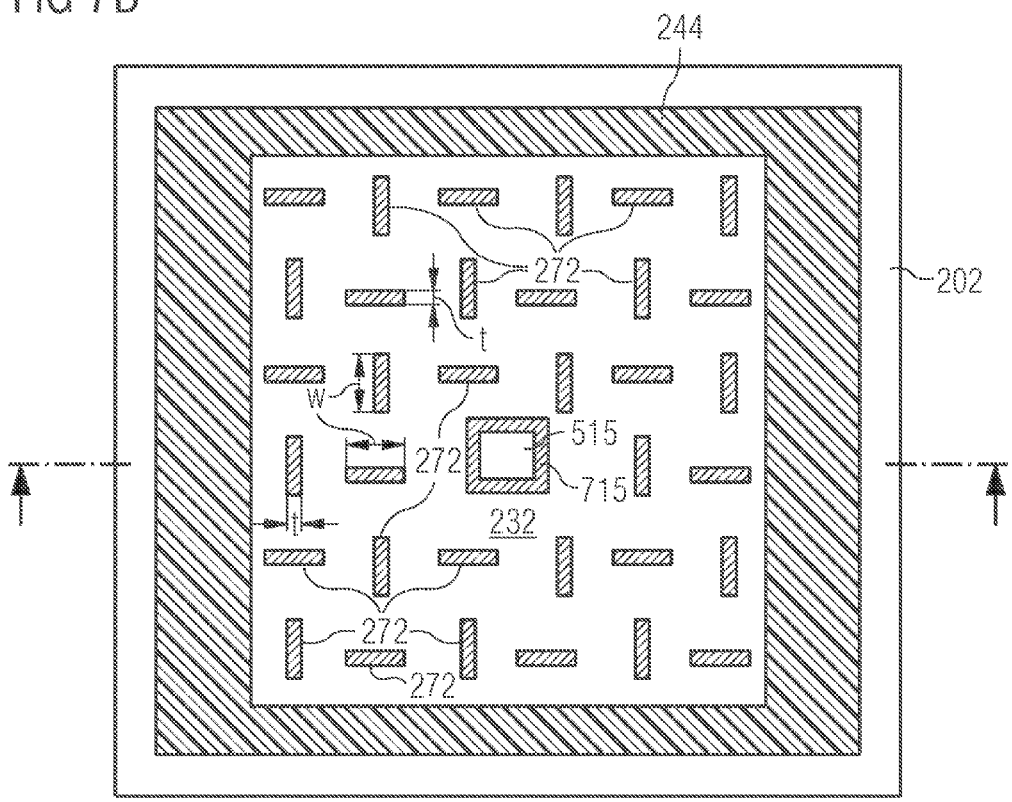

FIG. 7A shows another schematic cross-section of the MEMS microphone and FIG. 7B shows the corresponding schematic horizontal cross section that may have been performed at a height of the second diaphragm isolation 244. In the depicted example of a MEMS microphone, the second diaphragm isolation 244 may not only provide an electrical isolation between the second diaphragm element 214 and the second counter electrode element 224, but may also serves as a support for the second counter electrode element 224 and other structures that may be arranged on top of the second counter electrode element 224. Hence, the second diaphragm isolation 244 can be regarded as a part of a support structure, as well. The second diaphragm isolation 244 may also laterally confine or limit the low-pressure region 232. The pillars 272 can also be seen in FIGS. 7A and 7B. In a similar manner as the pillars 272, a channel 715 may be formed by four sidewalls that extend between the first diaphragm element 212 and the second diaphragm element 214. The channel 715 may have a square cross-section in the depicted example, but may have other cross-sectional shapes, as well. The channel 715 may seal the low-pressure region 232 against the ventilation hole 515.

In FIG. 7B it can be seen that each of the pillars 272 may have an elongate cross-section, in particular a rectangular cross-section. However, other cross-sectional shapes may be possible, as well. Hence, each of the pillars 272 may be significantly wider than thick, for example between three times and six times more wide than thick. The width of a pillar may be schematically indicated in FIG. 7B as "w" and the thickness of a pillar 272 may be schematically indicated in FIG. 7B by "t". A first subset of the pillars 272 may be oriented such that their cross-sectional width w extends along a first direction. A second subset of the pillars 272 may be oriented differently such that their cross-sectional width w extends in a second direction that may be not parallel to the first direction. In the example schematically illustrated in FIG. 7B, the second direction of cross-sectional orientation of the second subset of pillars 272 may be orthogonal to the first direction which describes the cross-sectional orientation of the pillars 272 within the first subset of pillars. In alternative embodiments, the plurality of pillars 272 could be subdivided in three or even more subsets of pillars each having different directions of cross-sectional orientation. The pillars 272 have different cross-sectional orientations in order achieve a substantially isotropic stiffness of the entire diaphragm arrangement against the overpressure exerted by the atmosphere onto the first and second diaphragm elements 212, 214. Furthermore, the at least some of the pillars 272 may be spaced apart from each other to leave sufficient space for the counter electrode arrangement 222, 224, 152, as will be seen in FIG. 8B.

Figure 8A:
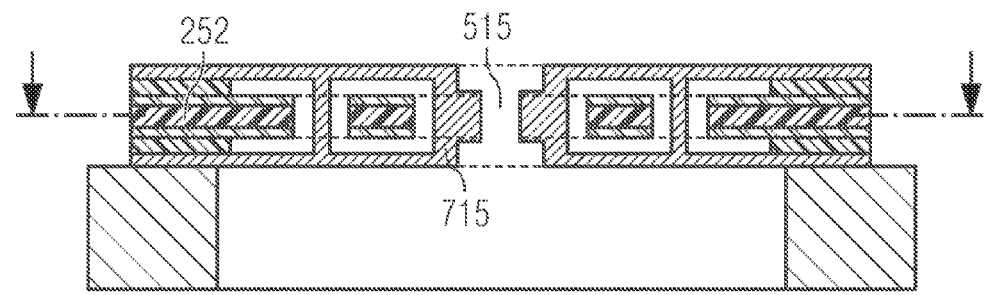
FIGS. 8A and 8B show schematic cross sections of the same MEMS microphone at yet a further cross-section position.
Figure 8B:
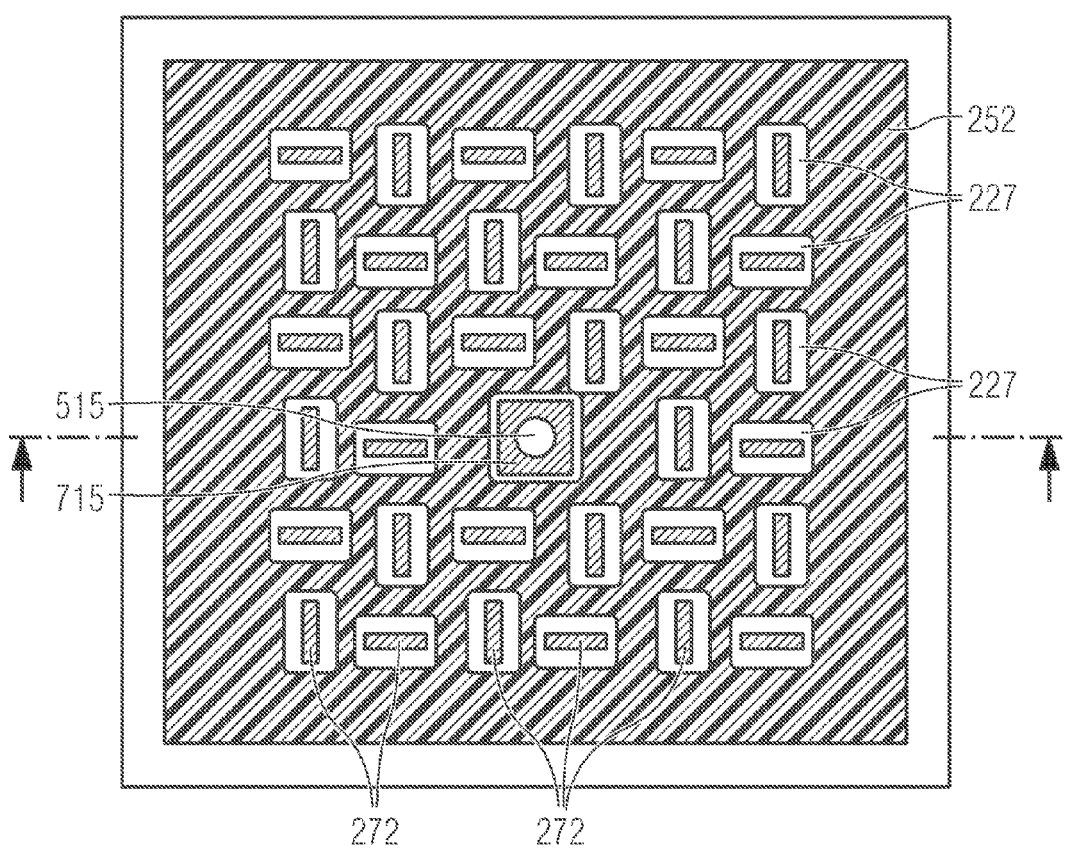

FIG. 8B shows a horizontal cross-section at the height of the counter electrode isolation 252. The geometry of the counter electrode isolation 252 may be in the depicted example also representative of the geometries of the first and second counter electrode elements 222 and 224, and thus for the entire counter electrode arrangement comprising the three layers of first counter electrode 222, counter electrode isolation 252, and second counter electrode element 224. The counter electrode isolation 252 may comprise holes 227. The pillars 272 may pass through the holes 227 without contacting the rims of the holes 227, i.e. with sufficient clearance. Thus, the diaphragm arrangement may move up and down with respect to the counter electrode arrangement when the diaphragm arrangement may be deflected up or down, which may happen mainly within its central portion when the diaphragm arrangement is exposed to a sound wave. Furthermore, the holes 227 within the counter electrode arrangement may prevent that the pillars 272 get into electrical contact with the first counter electrode 222 and/or the second counter electrode 224, which would cause a short circuit between the diaphragm arrangement and the counter electrode arrangement.

In order to provide some additional mechanical stability to the diaphragm arrangement, the sidewalls of the channel 715 in FIG. 8B may be thicker than in the horizontal cross section of FIG. 7B. The ventilation hole 515 may have a circular cross section at the position shown in FIG. 8B.

Figure 9A:
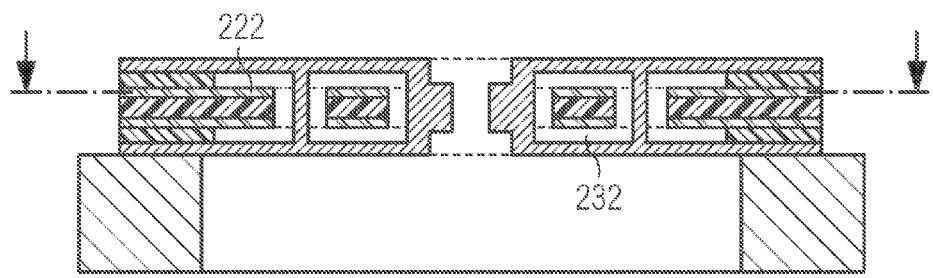
FIGS. 9A and 9B show schematic cross-sections of the same MEMS microphone at a further cross-section position.
Figure 9B:
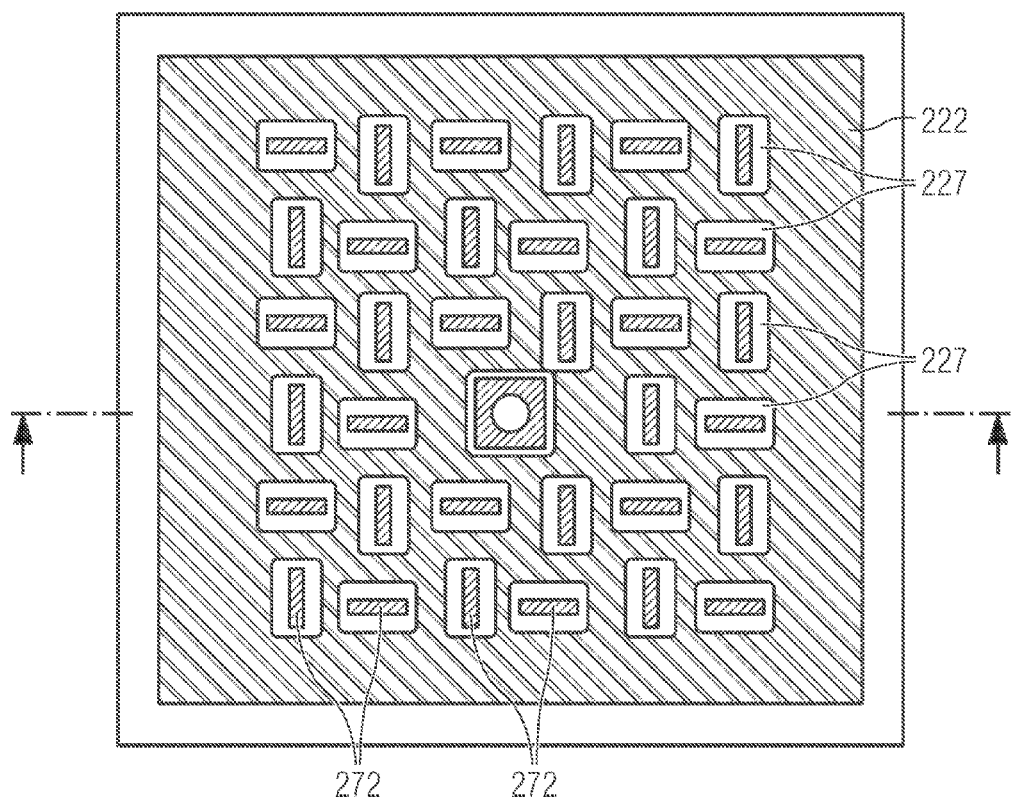

FIG. 9B shows a similar horizontal cross-section as FIG. 8B with the difference of the cross-section being performed at the height of the first counter electrode element 222.

Figure 10:
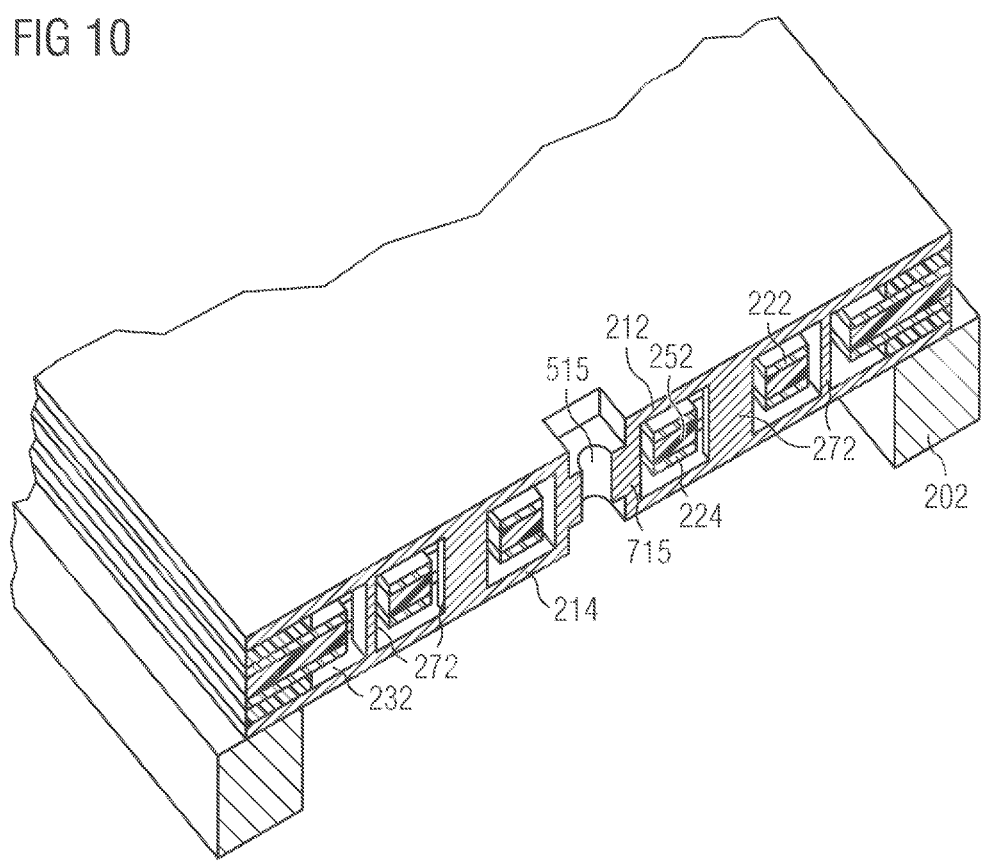
FIG. 10 shows a schematic perspective, partial cross-sectional view of a MEMS microphone.
Figure 11:
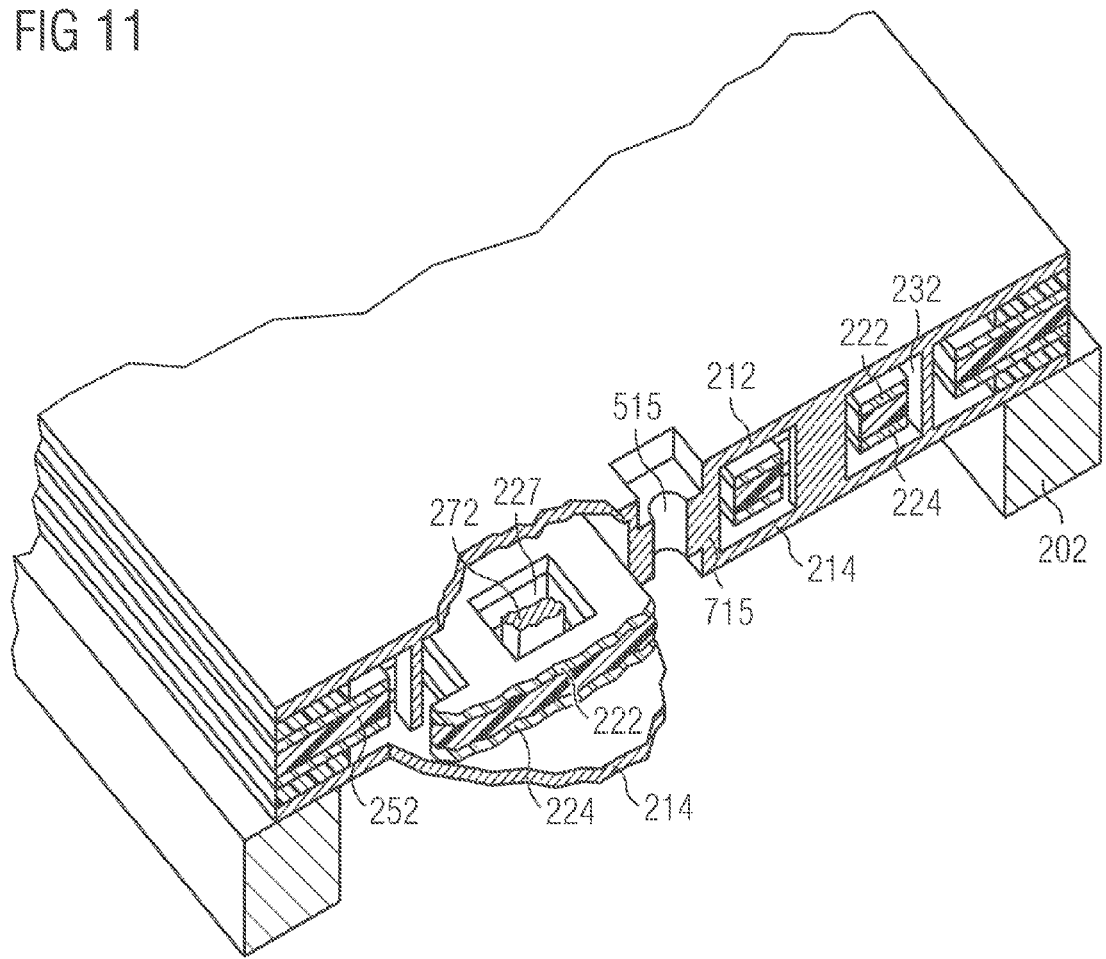
FIG. 11 shows a similar schematic, perspective, partial cross-sectional view as FIG. 10 to better illustrate some details of the MEMS microphone.

FIG. 10 shows a schematic, perspective cross-section view of the MEMS microphone. FIG. 11 shows a similar schematic, perspective cross-section view in which the relation of the counter electrode arrangement and the pillars 272 may be shown in further detail. In particular, FIG. 11 may show how one of the pillars 272 may pass through one of the holes 227 that may be formed in the counter electrode arrangement.

Figure 12:
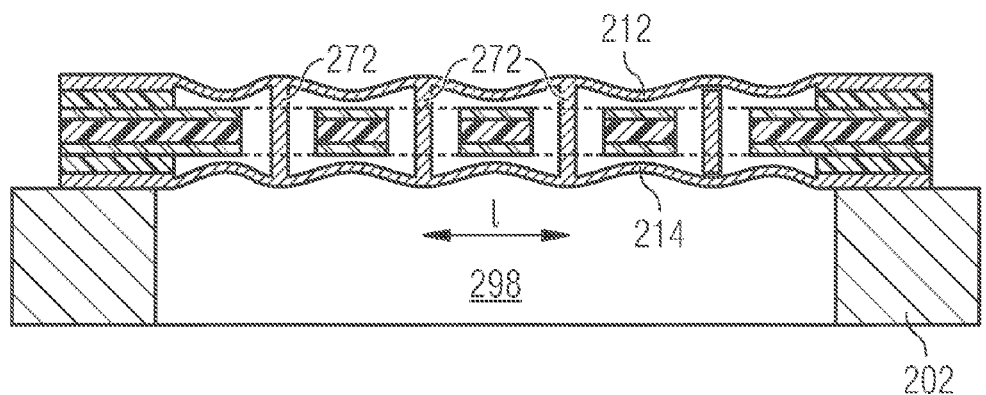
FIG. 12 shows a schematic cross-section of a MEMS microphone and the effect of the atmospheric pressure on the first and second diaphragm elements.

FIG. 12 shows a schematic cross-section of a MEMS microphone in which a bending of diaphragm sections may be schematically illustrated. Due to the vacuum or low-pressure between the first and second diaphragm elements 212, 214, the suspended diaphragm parts may be loaded with ambient pressure resulting in a bending. Due to the pillars 272 that may be typically regularly arranged between the first and second diaphragm elements 212, 214, the bending can be reduced to a relatively small amount.

Figure 13:
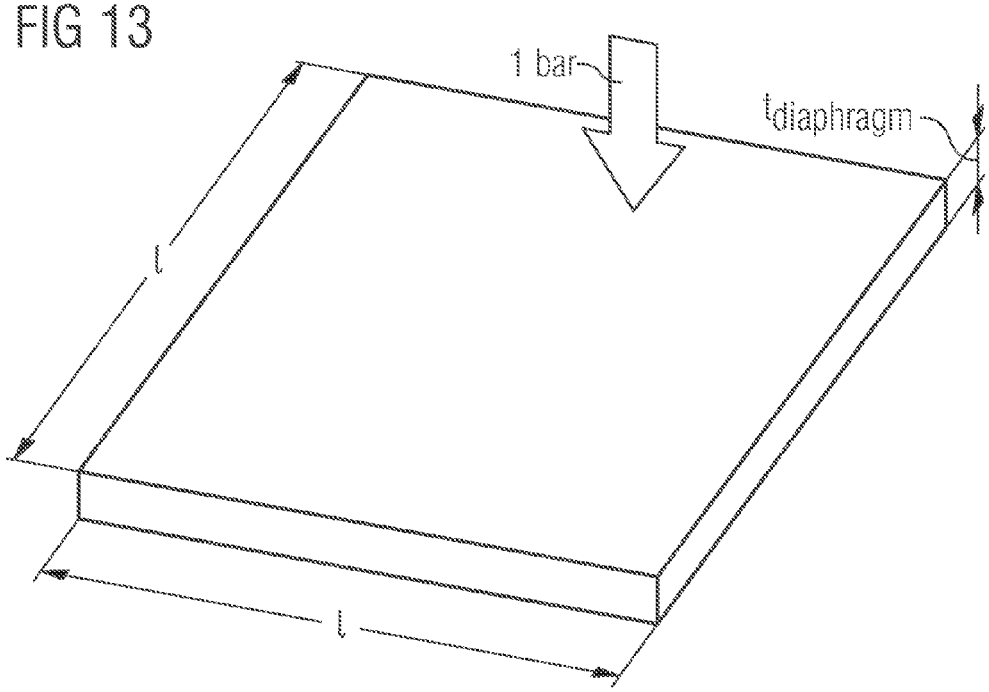
FIG. 13 illustrate a dimensioning of a diaphragm segment spanning the area between two or more pillars.
Figure 14:
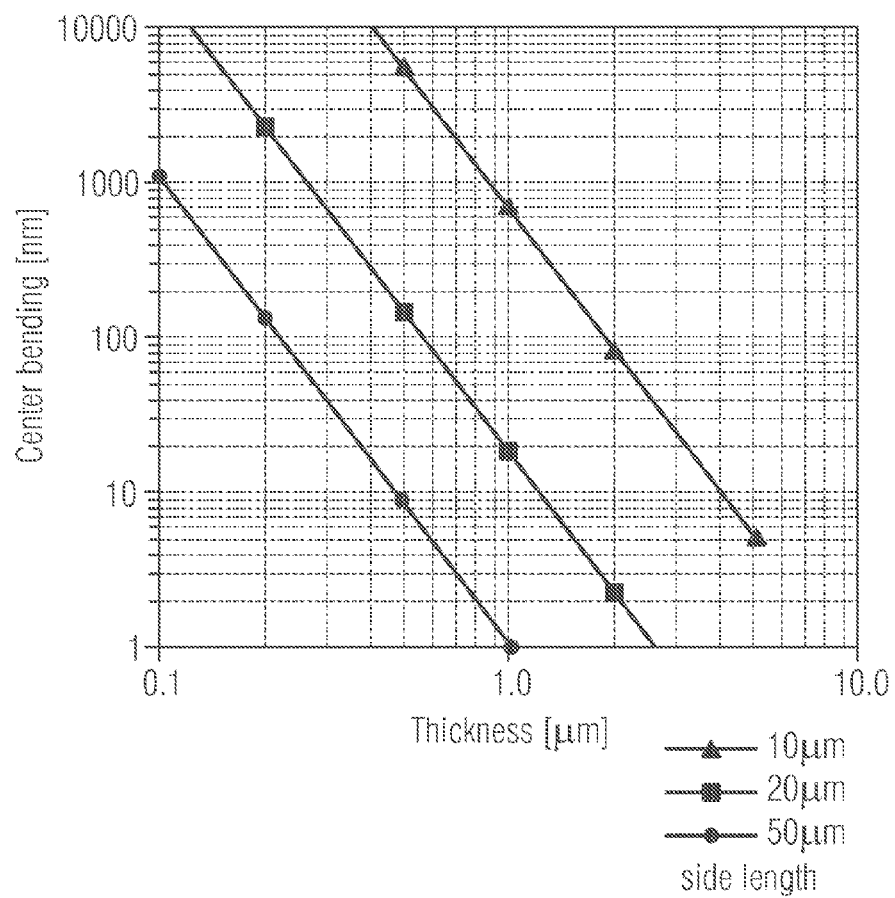
FIG. 14 schematically illustrates the amount of bending at the center of the diaphragm segment in FIG. 13 at atmospheric pressure as a function of the thickness and the side length of the diaphragm segment.

FIG. 13 schematically illustrates one suspended diaphragm part (membrane part). The lateral dimension "l" of the suspended diaphragm part, its thickness $t_{diaphragm}$, and its intrinsic stress may define the amount of bending. As an example, FIG. 14 graphically illustrates the results of calculations for the bending under 1 bar pressure (atmospheric pressure) of a small square segment of a stress-free polysilicon diaphragm for different thicknesses and side lengths. For typical dimensions (side length=20 μm, thickness=0.5 μm) the bending may be about 140 nm and acceptable for an air gap of typically 2 μm. Tensional stress in the diaphragm layer may additionally reduce the bending.

Figure 15:
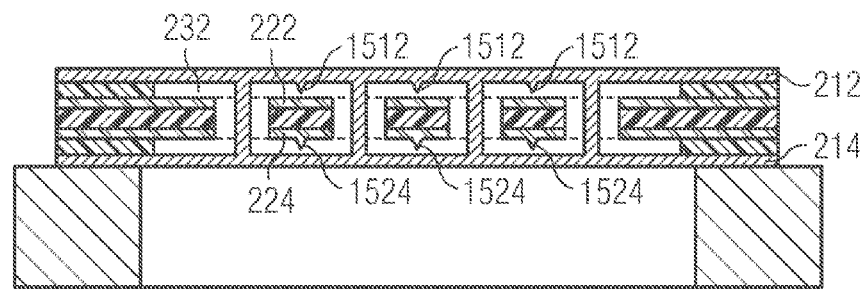
FIG. 15 shows a schematic cross-section of a MEMS microphone having anti-sticking bumps.

FIG. 15 shows a schematic cross-section of a MEMS microphone according to a possible embodiment that may have a low pressure region 232 between the first and second diaphragm elements 212, 214. According to the implementation example schematically illustrated in FIG. 15, the first diaphragm element 212 may comprise anti-sticking bumps 1512 that may be arranged at the surface of the first diaphragm element 212 that may face the low-pressure region 232. The anti-sticking bumps 1512 may reduce a risk of the first diaphragm element 212 getting stuck at the first counter electrode element 222 due to an adhesive force. In a similar manner, the second counter electrode element 224 may comprise a second plurality of anti-sticking bumps 1524 facing the second diaphragm element 214. The anti-sticking bumps 1512 may be integrated with the first diaphragm element 212. The anti-sticking bumps 1524 may be integrated as one part with the second counter electrode element 224.

Figure 16A:
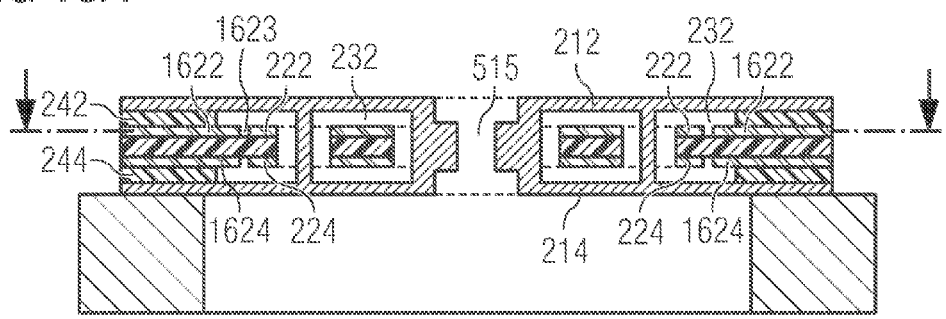
FIGS. 16A and 16B show schematic cross sections of a MEMS microphone having a laterally segmented counter electrode.
Figure 16B:
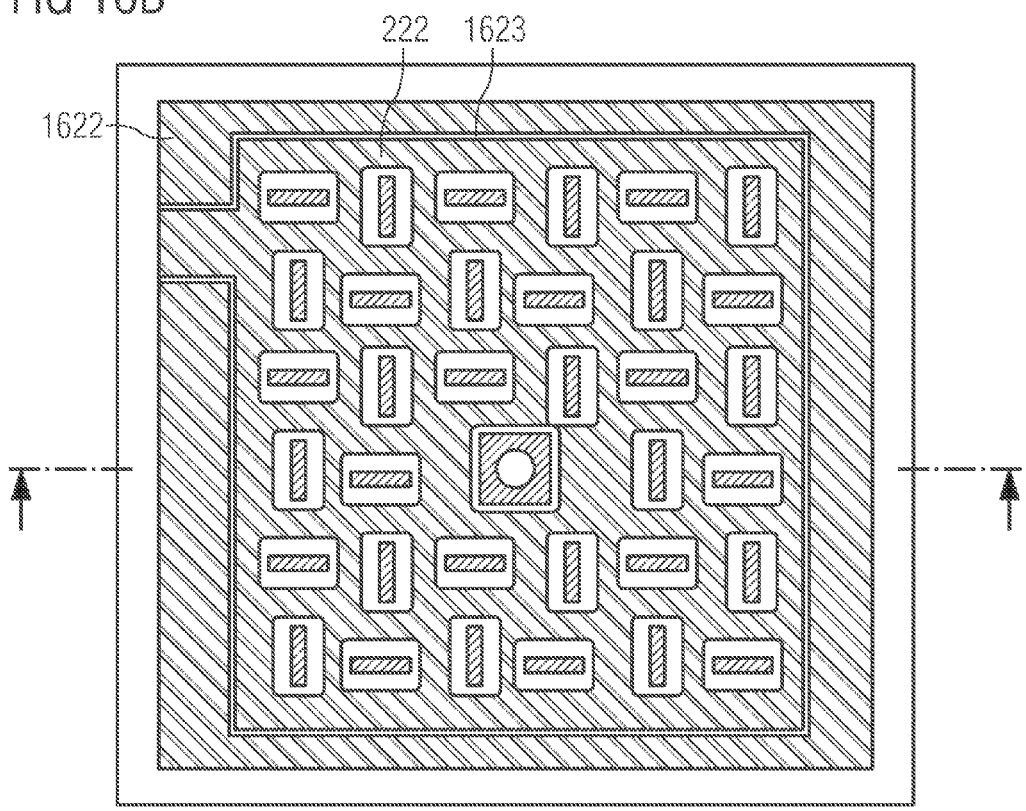

FIG. 16A shows a schematic cross-section of a MEMS microphone having a lateral segmentation of the counter electrodes. FIG. 16B shows a schematic horizontal section of the same MEMS microphone. In this embodiment, the first counter electrode element 222 does not extend into the support structure anymore except for a small contact strip for electrically contacting the first counter electrode element 222 with external circuitry such as power supply and read-out circuits. The first counter electrode element 222 may be laterally delimited by a gap 1623 that may electrically isolate the first counter electrode element 222 from a region of surrounding counter electrode material 1622. The first counter electrode element 222 may be limited to a center region of the MEMS microphone. The first diaphragm element 212 and the second diaphragm element 214 may undergo larger deflection due to an excitation by a sound wave in the center region than in a margin region. In the margin region, i.e. within the support structure and in the vicinity of the support structure, the first and second diaphragm elements 212, 214 may typically not significantly move in response to the sound wave. Therefore, the margin region might not contribute to a variation of the capacitances. The lateral segmentation of the first and second counter electrode elements 222, 224 may typically result in a larger percentage variation of the capacitance in response to a sound wave and consequently to a higher sensitivity of the MEMS microphone. The gap 1623 may be filled with the material of first diaphragm isolation 242 when passing through the support region in order to seal the low-pressure region 232 against the exterior ambient atmosphere. The same can be done with the gap between the second counter electrode element 224 and the corresponding margin material 1624 in that the second diaphragm isolation 244 may be used to fill the gap between the elements 224 and 1624. In the alternative, the gap 1623 and the gap around the second counter electrode element 224 may be filled with or replaced by dedicated isolating material.

Figure 17A:
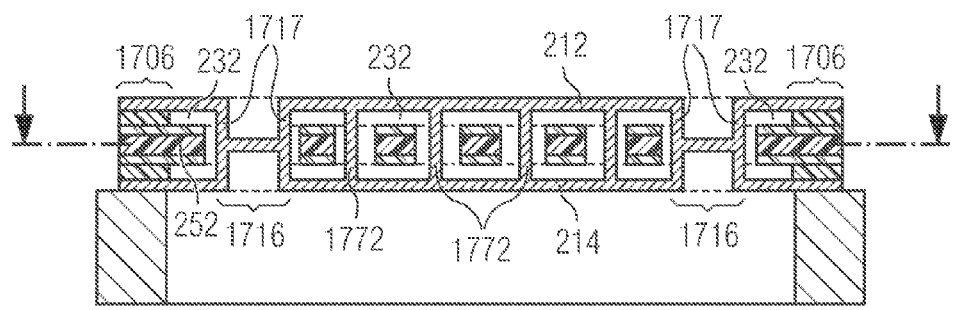
FIGS. 17A and 17B show schematic cross sections of a MEMS microphone comprising relatively soft diaphragm elements acting as hinges or suspensions for the first and second diaphragm elements.
Figure 17B:
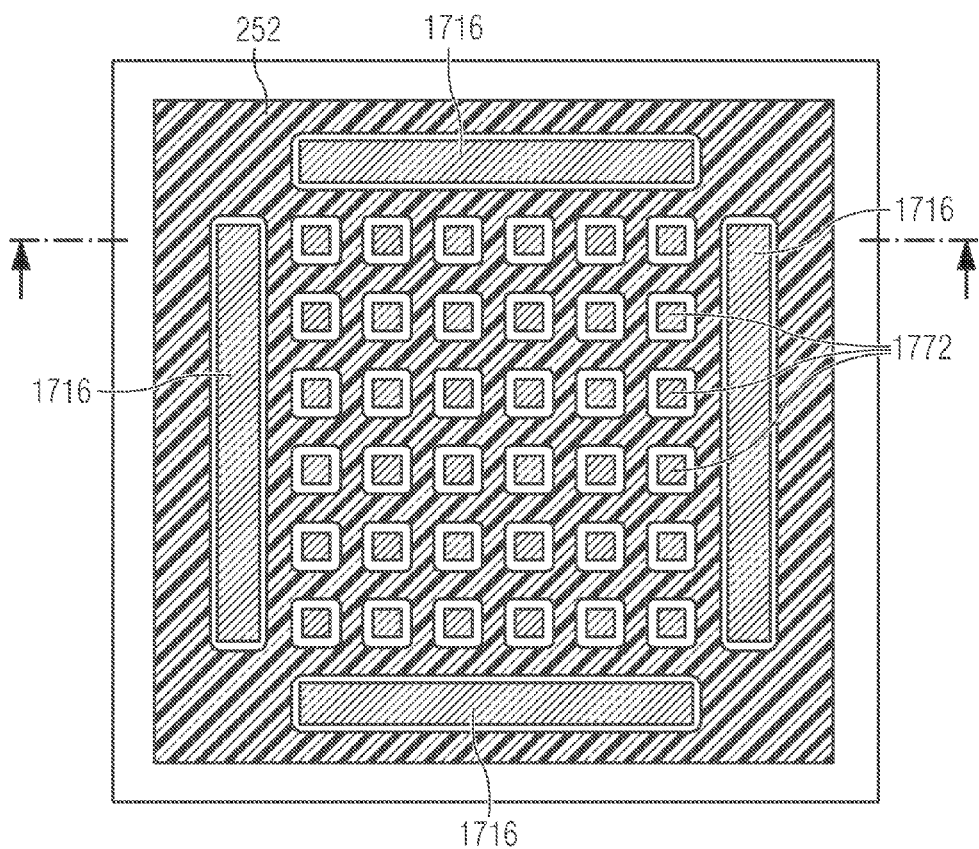

FIG. 17A shows a schematic cross section of a MEMS microphone as an example of how softer diaphragms or membranes may be introduced and may still be rigid against the low-pressure within the low-pressure region, i.e. between the first and second diaphragm elements 212, 214. FIG. 17B shows a corresponding horizontal section. The MEMS microphone may comprise a hinge element or third diaphragm element 1716. The hinge element or third diaphragm element 1716 may be coupled between the first diaphragm element 212 and a support structure 1706. The hinge element/third diaphragm element 1716 may have a stiffness which may be less than the stiffness of the first diaphragm element 212 and/or less than the stiffness of the second diaphragm element 214. The third diaphragm element 1716 may comprise a wall element 1717 configured to laterally confine the low-pressure region 232. The wall element 1717 may be coupled to the support structure 1706 so that the support structure 1706 may participate in confining the low-pressure region 232. The MEMS microphone schematically illustrated in FIGS. 17A and 17B may comprise four hinge elements/third diaphragm elements 1716. The first counter electrode element 222 may be coupled to the support structure 1706 independently from the hinge element 1716. This may be achieved by providing at least one gap in the hinge element 1716 through which the first counter electrode element 222 may extend from the low-pressure region 232 to the support structure 1706 in FIG. 17B. This may be schematically illustrated for the counter electrode isolation 252. The structure of the first counter electrode element 222 and the second counter electrode element 224 may be substantially similar to the structure of the counter electrode isolation 252. In the configuration shown in FIGS. 17A and 17B, there may be four gaps provided between the four hinge elements 1716, the four gaps being provided, for example, in the four corners of a square formed by the four hinge elements 1716.

FIG. 17C shows a schematic perspective cutaway view of the first and second diaphragm elements 212, 214 and two of the hinge elements 1716. For the sake of clarity, the counter electrode elements 222, 224 and the counter electrode isolation 252 have been omitted from illustration in FIG. 17C. It can be seen that each of the hinge elements 1716 may form a structure that can be described as a "double-trough" with the two troughs being arranged bottom-to-bottom to each other. In the corner, the two hinge elements 1716 do not necessarily meet each other and may leave the gap between the hinge elements 1716 which may allow the counter electrode structure to be mechanically and electrically coupled to the support structure independently from the diaphragm structure. The hinge elements 1716 may have an H-shaped cross section in this implementation example. In alternative implementations, the hinge element(s) 1716 could have, for example, a U-shaped cross section or another cross section, where for example the second diaphragm element 214 may be continuous to form the lower bar of the "U" and the first diaphragm element 212 may be interrupted by the wall element 1717. The dashed lines in FIG. 17C may schematically indicate some of the inner contours of the low pressure region 232.

FIGS. 18A to 18C schematically illustrate a further possible implementation of a MEMS microphones wherein the counter electrode elements may have approximately an X-shaped configuration. FIG. 18A may show a schematic top view of the first counter electrode element 1822 and of the hinge elements or third diaphragm element 1816. For the sake of clarity, some elements may have been omitted from illustration, for example the wall elements 1717 in FIGS. 17A to 17C. It can be seen that the first counter electrode element 222 may be suspended at the support structure 1706 by four arms that may extend in an X-shaped manner from a central portion of the first counter electrode element 222. As an alternative implementation, the first counter electrode element 1822 could be supported at the support structure by only one arm, two arms, three arms, or any other number of arms.

FIG. 18B shows a schematic cross-section through the MEMS microphone of FIG. 18A. FIG. 18C shows a corresponding horizontal section through the MEMS microphone. As can be seen in FIG. 18C, the cross-section of FIG. 18B may be done at an angled section plane so that a left portion in FIG. 18B shows a cross-section through the hinge element 1816 and a right portion of FIG. 18B shows a schematic cross-section through the counter electrode isolation 1852. The hinge element or third diaphragm element 1816 may comprise corrugation lines 1818 that promote a bending of the hinge element 1816 in this area. The bending of each hinge element 1816 may be described as a rotation about an axis that extends parallel to an elongate extension of the corrugation lines 1818. The wall element 1817 of the hinge element 1816 may participate in confining the low-pressure region 232 against the ambient atmosphere. To this end, the wall element 1817 may be coupled to the support structure 1706. In the example shown in FIGS. 18A to 18C, the wall element 1817 may comprise a first wall portion that may start at the support structure 1706 at an angle, a second wall portion that may extend substantially parallel to the support structure 1706, and a third wall portion that may merge with the support structure 1706 at an angle. In this manner, the wall element 1817 may form three sides of a trapezoid that surrounds the remainder of the hinge element 1816, in particular the portion comprising the corrugation lines 1818. A fourth side of the trapezoid may be formed by the support structure. Further vent holes 1815 may be formed within one or more of the hinge element(s) 1816. The ventilation holes 1815 may be configured to facilitate a static pressure equalization between the ambient pressure and the backside cavity 298. As explained above, there may also a be further vent hole 515 in a central pillar 715.

Figure 19:
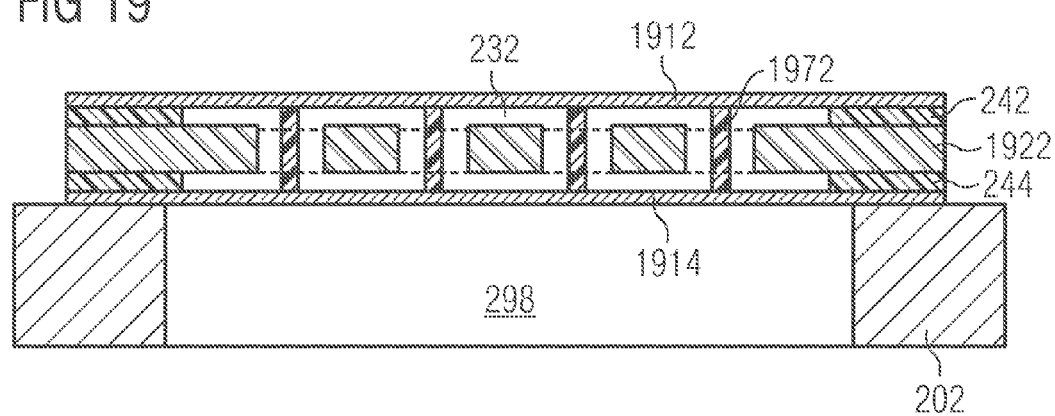
FIG. 19 shows a schematic cross-section of a MEMS microphone comprising a single counter electrode and first and second diaphragm elements that may be electrically isolated against each other.

FIG. 19 shows a further example of a possible implementation of a MEMS microphone where the stator, i.e. the counter electrode arrangement, may be realized as a single electrode and the movable diaphragm structure comprises two electrodes that may be electrically isolated against each other. The MEMS microphone may comprise a first diaphragm element 1912 and a second diaphragm element 1914. The first diaphragm element 1912 may be mechanically coupled to the second diaphragm element 1914 via a plurality of electrically isolating pillars 1972. The counter electrode arrangement may comprise a single counter electrode element 1922 of electrically conducting material. It may be also possible to provide two counter electrodes that may be electrically isolated against each other, and additionally two diaphragms, that may be also electrically isolated against each other, i.e., four different electrodes for the MEMS microphone.

Figure 20A:
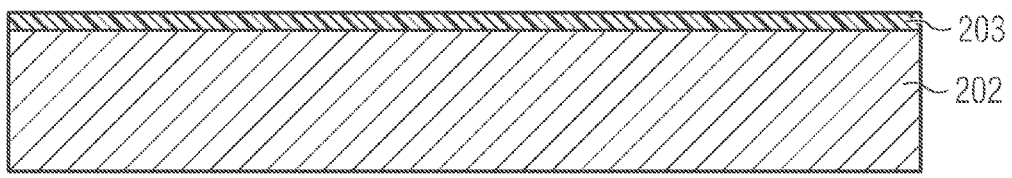
FIGS. 20A to 20O schematically illustrate a process flow of a method for manufacturing a MEMS microphone.
Figure 20B:
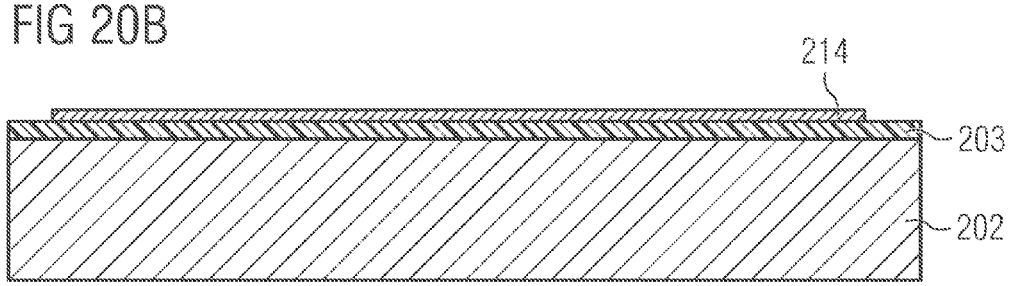
Figure 20C:
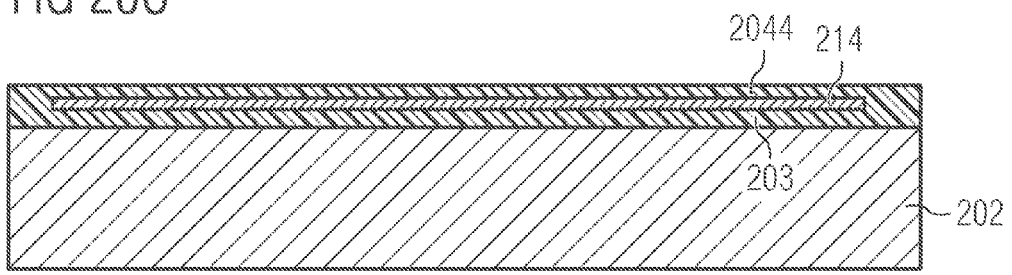
Figure 20D:
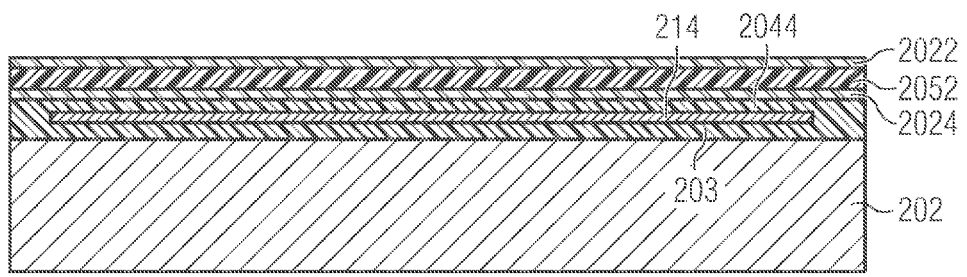
Figure 20E:
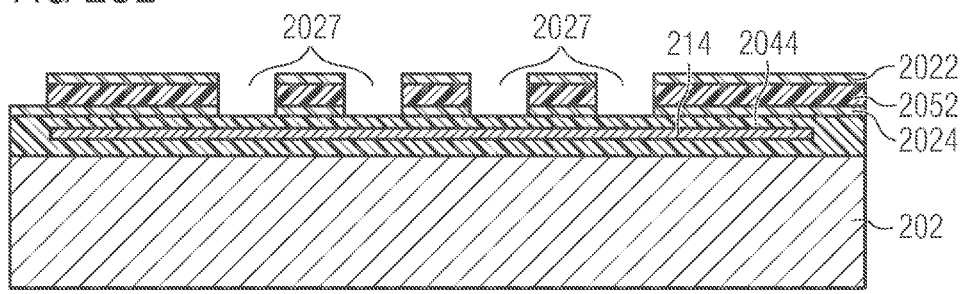
Figure 20F:
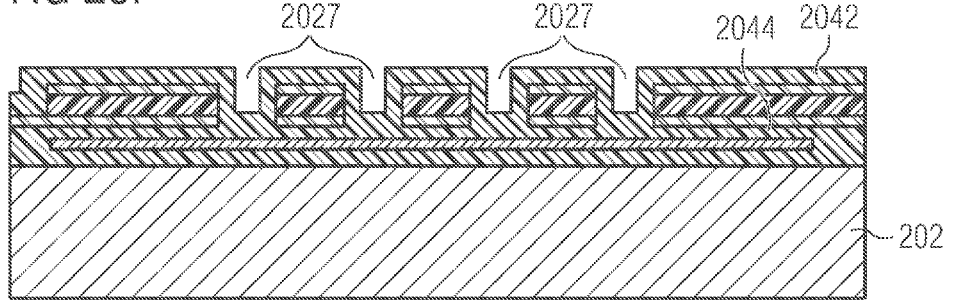
Figure 20G:
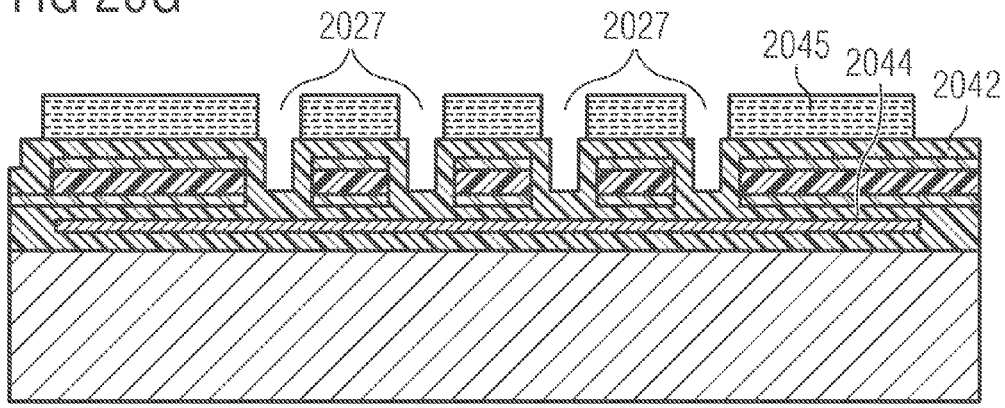
Figure 20H:
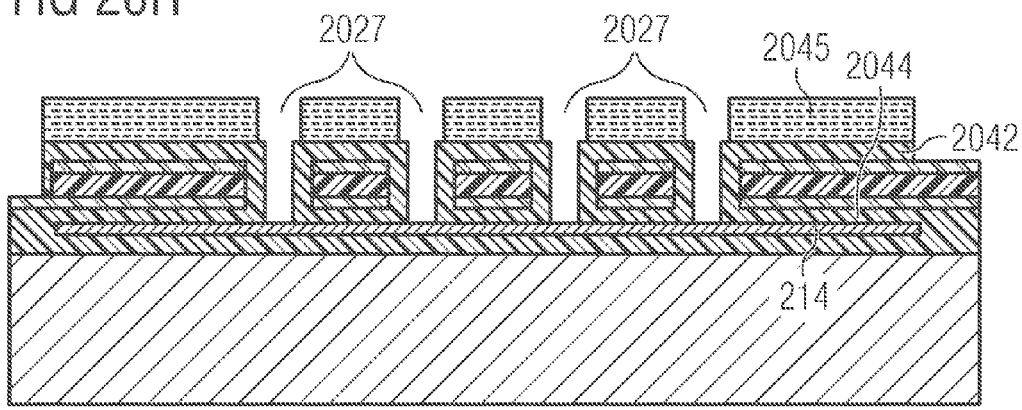
Figure 20I:
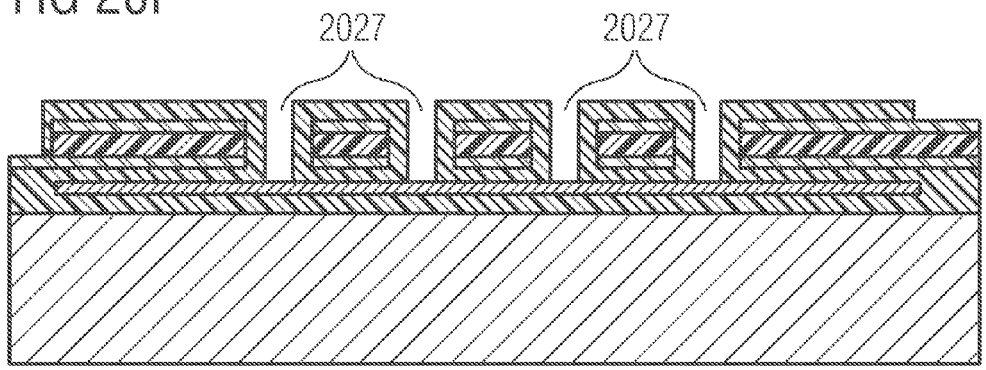
Figure 20J:
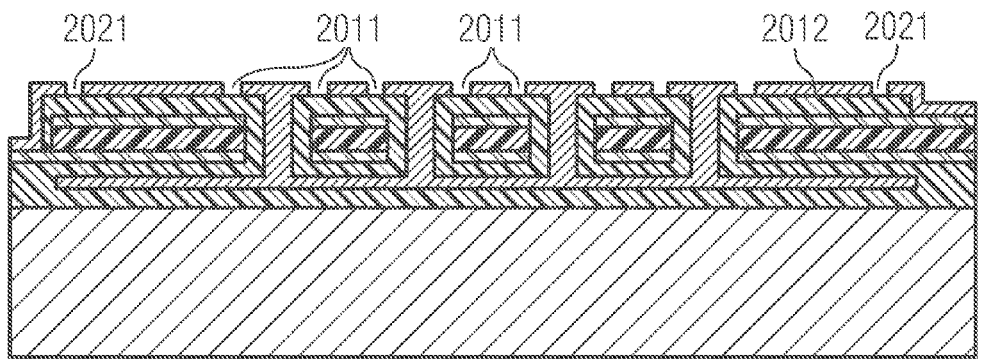
Figure 20K:
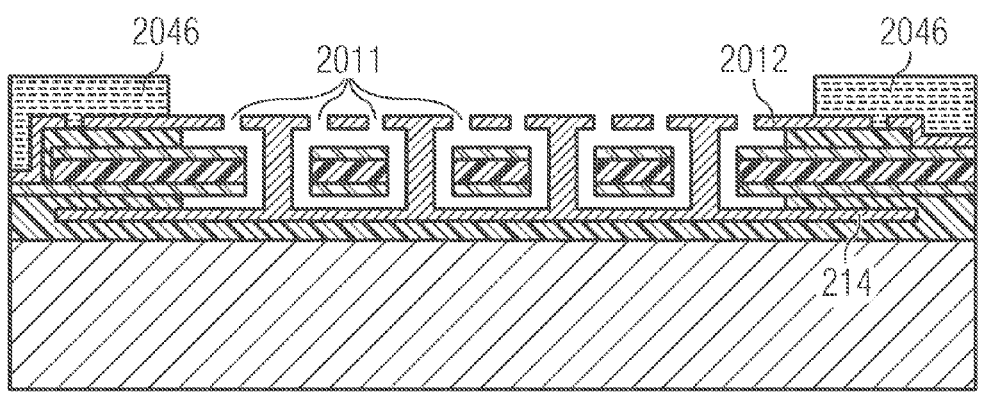
Figure 20L:
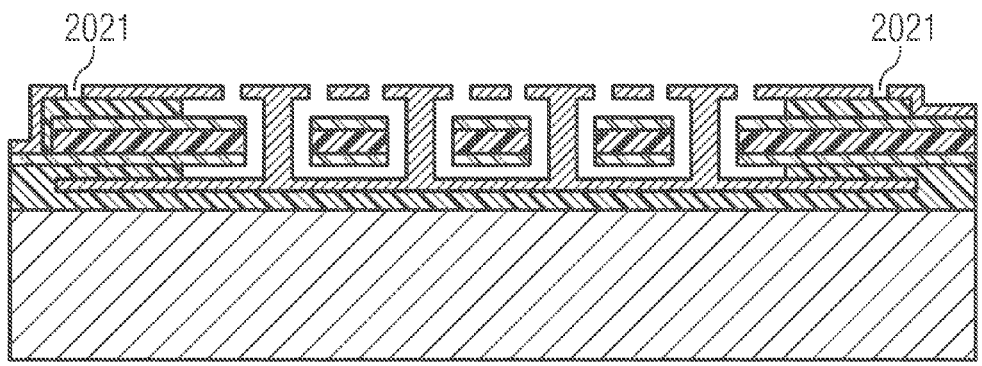
Figure 20M:
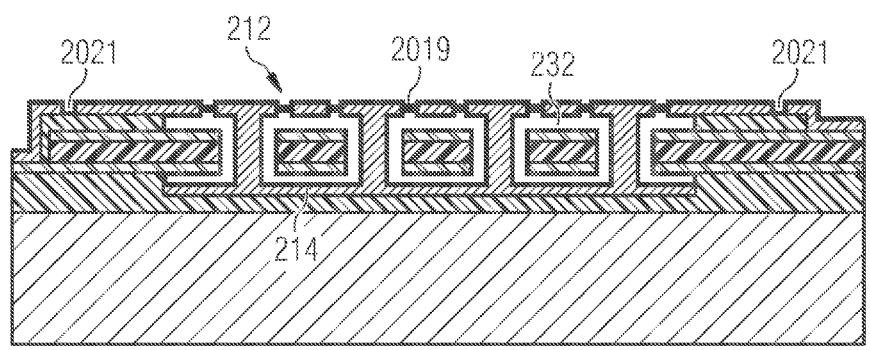
Figure 20N:
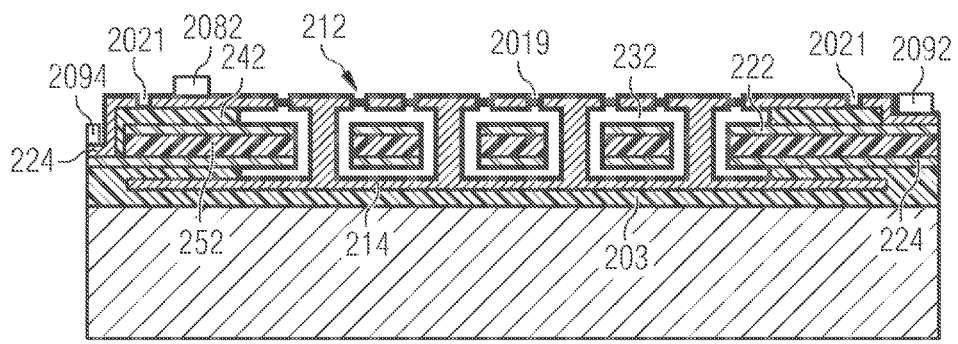
Figure 20O:
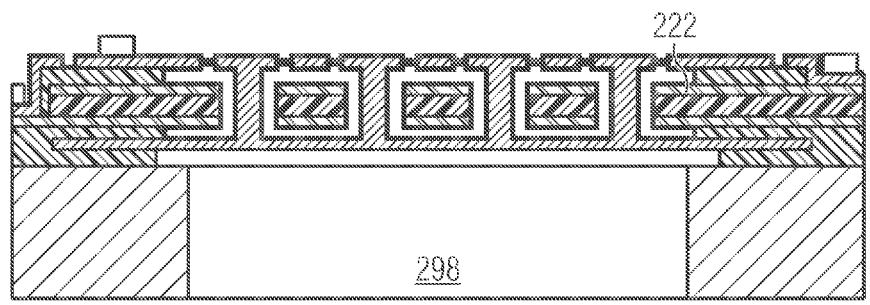

FIGS. 20A to 20O show schematic cross sections through a portion of a wafer during various stages or steps of a possible example for a manufacturing process of a MEMS microphone as described above. Any dimensions, thickness values of the various layers, material selections, etc. are examples, only, and may therefore by changed.

FIG. 20A shows the substrate 202 which may be a silicon wafer in which silicon may be arranged in mono-crystalline structure. A lower etch stop layer 203 may have been deposited at an upper main surface of the substrate 202. The lower etch stop layer 203 may ensures a reliable stop of an etching process for forming the cavity 298 which may occur at a later stage of the manufacturing process. The lower etch stop layer 203 may be typically made from an oxide, a thermal oxide, or TEOS, for example. It's thickness may be between 0.1 and 1 μM.

FIG. 20B shows a schematic cross-section of the wafer after a layer for the second diaphragm element 214 has been deposited on the lower etch stop layer 203. Furthermore, the second diaphragm element 214 may also be already structured in FIG. 20B. The material may be doped poly-silicone which may be deposited as a doped polysilicon layer as part of the motor of the MEMS microphone. The layer 214 may be typically between 0.5 and 2 μm thick.

FIG. 20C shows a schematic cross-section through the wafer after a layer of sacrificial oxide 2044 for a lower gap has been deposited on the structure shown in FIG. 20B. The sacrificial oxide may be substantially the same material as the material for the lower etch stop layer 203. The thickness of the deposited second diaphragm oxide 2044 on top of the second diaphragm element 214 may be typically between about 0.5 and 2 μm, depending on the desired gap width for the MEMS microphone.

FIG. 20D shows a schematic cross-section after the various layers of a multilayer stator have been deposited on the previously deposited sacrificial oxide 2044. The multilayer stator may comprise in the depicted example three layers: a layer 2024 for subsequently forming the second counter electrode element 224, a layer 2052 of electrically insulating material for subsequently forming the counter electrode isolation 252, and a layer 2022 for subsequently forming the first counter electrode element 222. The layers 2024 and 2022 may be of doped polysilicon or comprise doped polysilicon. The layer 2052 may comprise silicon nitride SiN. Other materials may be also possible, for example monocrystalline silicon (bulk or silicon-on-insulator, SOI), poly-crystalline silicon, metal (e.g., aluminum or a AlSiCu). Dielectric layers may comprise an oxide, Si3N4, $Si_xN_yO$, poly imide, etc. The thicknesses of the various layers of the multilayer stator may be, for example between about 0.1 and 1 μm for the layers of the first and second counter electrode elements 2022, 2024 and between about 0.1 and 0.5 μm for the layer of the counter electrode isolation 2052.

FIG. 20E shows a schematic cross-section after the multilayer stator comprising the three layers 2024, 2052, and 2022 may have been structured and, in particular, openings 2027 or trenches may have been formed in the multilayer stator, said openings 2027 possibly extending to the second diaphragm isolation layer 2044, for example.

The openings 2027 may be then filled by means of a deposition process, for example a TEOS deposition 2042 with a thickness between about 0.5 and 5 μm. In case the second diaphragm isolation layer 2044 may be of the same material than the deposited material, the two layers may merge and may form one structure. A schematic cross-section after a TEOS deposition may be shown in FIG. 20F. Other deposition materials may be possible, as well.

FIG. 20G shows a schematic cross-section after a mask 2045 may have been deposited on the second diaphragm isolation layer 2042 and structured. Then, a so-called spacer etch process (pillar etch process) may be performed, the results of which can be seen in FIG. 20H. In particular the holes 2027 may have been extended with respect to their depth so that they now may reach down to the second diaphragm element 214.

In FIG. 20I the mask 2045 may have been removed. The holes 2027 may now define the shape of the future pillars 272. In a subsequent step a further deposition of doped polysilicon 2012 may be performed which fills the holes 2027 (FIG. 20J). The thickness of the deposited doped polysilicon may be between about 0.5 and 2 μm, for example.

Subsequently, the deposited doped polysilicon 2012 may be structured. By structuring the first diaphragm layer 2012, a plurality of small holes 2011 may be created in the first diaphragm layer 2012. Each hole may have a diameter of, for example, between about 0.1 and 1 μm. The small holes 2011 may subsequently be used as etch holes and then closed again. FIG. 20J shows a schematic cross-section after the first diaphragm layer 2012 has been deposited and structured. Concurrently with the formation of the small etch holes 2011, a lateral segmentation of the first diaphragm layer 2012 may be performed by forming a gap 2021 which may separate the first diaphragm 212, which may be completed subsequently, from a surrounding portion of the first diaphragm material 2012. The surrounding portion of the first diaphragm material may subsequently be used to electrically contact the first counter electrode element 222, the second counter electrode element 224, and/or the second diaphragm element 214.

FIG. 20K shows a schematic cross-section after the lateral segmentation 2021 may have been temporarily covered by means of a mask 2046. Using the remaining small holes 2011 that have not been masked, a release etch may be performed in order to remove the oxide between the second diaphragm layer 214 and the first diaphragm layer 2012. The release etch process may be time-controlled so that a margin portion of the sacrificial material 2042, 2044 might not be etched away by the etching agent because the distance of the nearest hole 2011 may be too large for the etching agent to reach this margin portion during the duration of the release etch process. Instead of a time-controlled etching process, other forms for providing an etch stop may be used, as well.

FIG. 20L shows a schematic cross section after the mask 2046 may have been removed. In FIG. 20M an etching hole closure may have been performed to close the small holes 2011 with a suitable closure material 2019, which may be schematically indicated in FIG. 20M and the subsequent FIGS. 20N and 20O by a thick line. This closure step may be performed under a low pressure atmosphere or a (near-) vacuum in order to obtain the low pressure region 232. The etching hole closure may comprise one or more of the following actions:

coating with a non-conformal deposition of oxide under low pressure, or deposition of BPSG (borophosphosilicate glass) and later reflow under low pressure/vacuum, or lamination of a foil under low pressure/vacuum.

FIG. 20M illustrates the case of deposition of BPSG which also may result in the BPSG to cover the inner side walls of the low pressure region 232.

FIG. 20N shows a schematic cross section of a MEMS microphone during manufacture after contact holes may have been etched. A first contact 2082 may be formed within a first contact hole and may provide an electrical connection for the first diaphragm element 212. A second contact 2092 may be provided within a second contact hole to provide an electrical connection for the first counter electrode element 222. A third contact 2094 may be provided within a third contact hole as an electrical connection for the second counter electrode element 224. Note that the lateral segmentation(s) 2021, the first diaphragm isolation 242, and the counter electrode isolation 252 provide electrical isolation between the different contacts 2082, 2092, 2094, for example. A contact for the second diaphragm element 214 may be not explicitly shown in FIG. 20N, but can be formed in an analog manner than the contacts 2082, 2084, 2092, for example.

FIG. 20O shows the final MEMS microphone in schematic cross section after backside etching of the backside cavity 298, for example by means of a DRIE/Bosch Process (DRIE: Deep Reactive Ion Etching). The lower etch stop layer 203 may act as an etch stop for the DRIE process and may have been removed after the DRIE process by a further dedicated oxide etching process.

Although some aspects have been described in the context of a device, it is clear that these aspects also represent a description of the corresponding method, where a block or device corresponds to a method step or a feature of a method step. Analogously, aspects described in the context of a method step also represent a description of a corresponding block or item or feature of a corresponding device.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

Although each claim only refers back to one single claim, the disclosure also covers any conceivable combination of claims.

What is claimed is:

1. A MEMS microphone comprising:
a first diaphragm element;
a second diaphragm element spaced apart from the first diaphragm element;
a low pressure region between the first diaphragm element and the second diaphragm element, the low pressure region having a pressure less than an ambient pressure;
a first counter electrode element disposed within the low pressure region; and
a second counter electrode element spaced apart from the first counter electrode element and disposed within the low pressure region.

2. The MEMS microphone according to claim 1, wherein the pressure in the low pressure region is substantially a vacuum.

3. The MEMS microphone according to claim 1, wherein the pressure in the low pressure region is less than about 50% of the ambient pressure.

4. The MEMS microphone according to claim 1, wherein the low pressure region is formed by the first diaphragm element and the second diaphragm element.

5. The MEMS microphone according to claim 1, wherein the first diaphragm element is electrically coupled to the second diaphragm element.

6. The MEMS microphone according to claim 1, wherein the first diaphragm element is electrically isolated from the second diaphragm element.

7. The MEMS microphone according to claim 1, wherein the first counter electrode element is electrically isolated from the second counter electrode element.

8. The MEMS microphone according to claim 1, wherein the first diaphragm element has a diaphragm compliance of at least about 1 nm/Pa.

9. The MEMS microphone according to claim 1, wherein the first diaphragm element has a diaphragm compliance of at least about 5 nm/Pa.

10. The MEMS microphone according to claim 1, wherein the low pressure region is within a sealed cavity.

11. The MEMS microphone according to claim 1, further comprising a hinge element coupled between the first diaphragm element and a support structure.

12. The MEMS microphone according to claim 11, wherein the hinge element comprises a wall element configured to laterally confine the low pressure region.

13. The MEMS microphone according to claim 12, wherein the wall element is coupled to the support structure so that the support structure participates in confining the low pressure region.

14. The MEMS microphone according to claim 12, wherein the counter electrode element is coupled to the support structure independently from the hinge element through at least one gap in the hinge element extending from the low pressure region to the support structure.

15. A MEMS microphone, comprising:
a first diaphragm element;

a second diaphragm element spaced apart from the first diaphragm element;

a low pressure region disposed between the first diaphragm element and the second diaphragm element, the low pressure region having a pressure less than an ambient pressure;

a first counter electrode element disposed within the low pressure region; and one or more pillars coupled between the first diaphragm element and the second diaphragm element, wherein the one or more pillars are electrically conductive.

16. The MEMS microphone of claim 15, wherein the pressure in the low pressure region is substantially a vacuum.

17. The MEMS microphone of claim 15, wherein the pressure in the low pressure region is less than 50% of the ambient pressure.

18. The MEMS microphone of claim 15, wherein the low pressure region is within a sealed cavity.

19. The MEMS microphone of claim 15, further comprises a second counter electrode element electrically isolated from the first counter electrode element and arranged in the low pressure region.

20. The MEMS microphone according to claim 15, wherein at least two pillars are spaced apart from each between 5 μm and 20 μm.

21. The MEMS microphone of claim 15, further comprising a third diaphragm element, the third diaphragm element having a stiffness which is less than the stiffness of the first diaphragm element or the stiffness of the second diaphragm element.

22. The MEMS microphone of claim 21, wherein the third diaphragm element is coupled between a support structure and at least one of the first diaphragm element and the second diaphragm element.

23. The MEMS microphone of claim 22, wherein the first counter electrode element is supported at the support structure independently from the third diaphragm element.

24. A MEMS microphone, comprising:

a first diaphragm element;

a second diaphragm element spaced apart from the first diaphragm element;

a low pressure region disposed between the first diaphragm element and the second diaphragm element, the low pressure region having a pressure less than an ambient pressure;

a first counter electrode element disposed within the low pressure region; and a third diaphragm element, the third diaphragm element having a stiffness which is less than the stiffness of the first diaphragm element or the stiffness of the second diaphragm element.

* * * * *